United States Patent
Frodis et al.

(10) Patent No.: US 7,271,888 B2
(45) Date of Patent: *Sep. 18, 2007

(54) METHOD AND APPARATUS FOR MAINTAINING PARALLELISM OF LAYERS AND/OR ACHIEVING DESIRED THICKNESSES OF LAYERS DURING THE ELECTROCHEMICAL FABRICATION OF STRUCTURES

(75) Inventors: Uri Frodis, Los Angeles, CA (US); Adam L. Cohen, Los Angeles, CA (US); Michael S. Lockard, Lake Elizabeth, CA (US)

(73) Assignee: Microfabrica Inc., Van Nuys, CA (US)

( * ) Notice: Subject to any disclaimer, the term of this patent is extended or adjusted under 35 U.S.C. 154(b) by 341 days.

This patent is subject to a terminal disclaimer.

(21) Appl. No.: 11/029,220

(22) Filed: Jan. 3, 2005

(65) Prior Publication Data
US 2005/0142846 A1    Jun. 30, 2005

Related U.S. Application Data

(60) Provisional application No. 60/534,159, filed on Dec. 31, 2003, provisional application No. 60/534,183, filed on Dec. 31, 1003.

(51) Int. Cl.
*G01N 21/88* (2006.01)
(52) U.S. Cl. ........................ 356/237.1; 451/6; 438/14
(58) Field of Classification Search ............ 356/237.1, 356/394, 630; 451/6; 438/14
See application file for complete search history.

(56) References Cited

U.S. PATENT DOCUMENTS

| 5,190,637 | A | 3/1993 | Guckel ..................... 205/118 |
| 5,718,618 | A | 2/1998 | Guckel et al. ............... 451/41 |
| 6,027,630 | A | 2/2000 | Cohen ..................... 205/135 |
| 6,458,014 | B1* | 10/2002 | Ihsikawa et al. ............. 451/6 |
| 7,163,614 | B2 | 1/2007 | Cohen ..................... 205/118 |
| 2004/0007470 | A1 | 1/2004 | Smalley ................... 205/118 |
| 2005/0181316 | A1* | 8/2005 | Frodis et al. .............. 430/455 |
| 2005/0202180 | A1 | 9/2005 | Cohen et al. ............. 427/402 |

OTHER PUBLICATIONS

Cohen, et al., "EFAB: Batch Production of Functional, Fully-Dense Metal Parts with Micron-Scale Features", Proc. 9th Solid Freeform Fabrication, The University of Texas at Austin, Aug. 1998, pp. 161.

(Continued)

*Primary Examiner*—Quoc Hoang
(74) *Attorney, Agent, or Firm*—Dennis R. Smalley

(57) ABSTRACT

Some embodiments of the present invention provide processes and apparatus for electrochemically fabricating multilayer structures (e.g. mesoscale or microscale structures) with improved endpoint detection and parallelism maintenance for materials (e.g. layers) that are planarized during the electrochemical fabrication process. Some methods involve the use of a fixture during planarization that ensures that planarized planes of material are parallel to other deposited planes within a given tolerance. Some methods involve the use of an endpoint detection fixture that ensures precise heights of deposited materials relative to an initial surface of a substrate, relative to a first deposited layer, or relative to some other layer formed during the fabrication process. In some embodiments planarization may occur via lapping while other embodiments may use a diamond fly cutting machine.

16 Claims, 20 Drawing Sheets

OTHER PUBLICATIONS

Adam L. Cohen, et al., "EFAB: Rapid, Low-Cost Desktop Micromachining of High Aspect Ratio True 3-D MEMS", Proc. 12th IEEE Micro Electro Mechanical Systems Workshop, IEEE, Jan. 17-21, 1999, pp. 244-251.

"Microfabrication—Rapid Prototyping's Killer Application", Rapid Prototyping Report, CAD/CAM Publishing, Inc., Jun. 1999, pp. 1-5.

Adam L. Cohen, "3-D Micromachining by Electrochemical Fabrication", Micromachine Devices, Mar. 1999, pp. 6-7.

Gang Zhang, et al., "EFAB: Rapid Desktop Manufacturing of True 3-D Microstructures", Proc. 2nd International Conference on Integrated MicroNanotechnology for Space Applications, The Aerospace Co., Apr. 1999.

F. Tseng, et al., "EFAB: High Aspect Ratio, Arbitrary 3-D Metal Microstructures Using a Low-Cost Automated Batch Process", 3rd International Workshop on High Aspect Ratio Microstructure Technology (HARMST'99), Jun. 1999.

Adam L. Cohen, et al., "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, Sep. 1999.

F. Tseng, et al., "EFAB: High Aspect Ratio, Arbitrary 3-D Metal Microstructures Using a Low-Cost Automated Batch Process", MEMS Symposium, ASME 1999 International Mechanical Engineering Congress and Exposition, Nov. 1999.

Adam L. Cohen, "Electrochemical Fabrication (EFABTM)", Chapter 19 of the MEMS Handbook, edited by Mohamed Gad-El-Hak, CRC Press, 2002, pp. 19/1-19/23.

\* cited by examiner

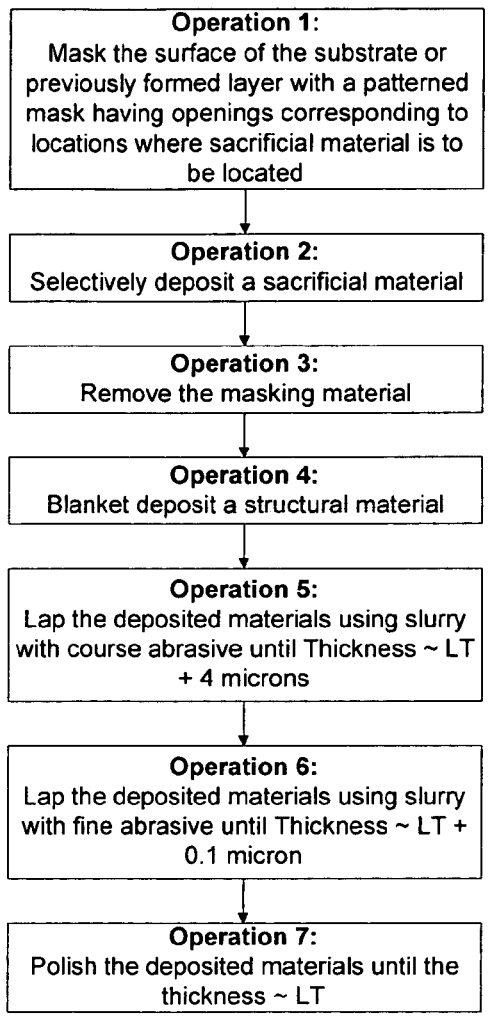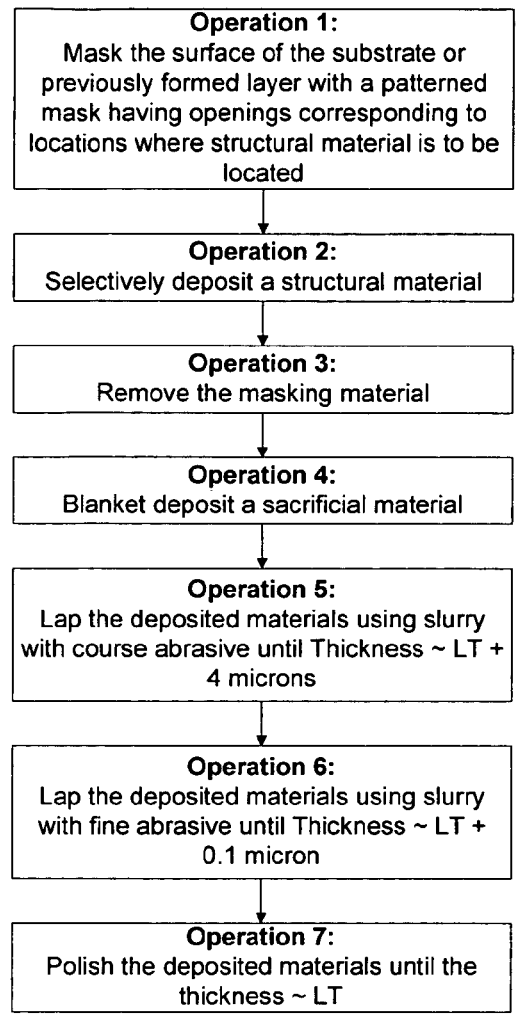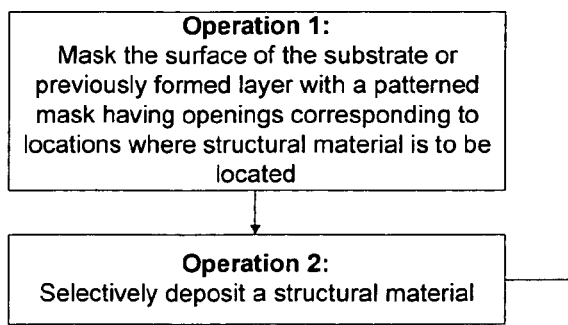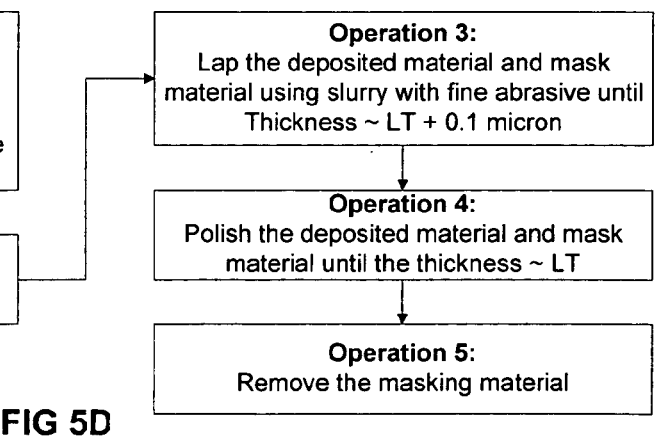
FIG 5B
FIG 5C
FIG 5D

METHOD AND APPARATUS FOR MAINTAINING PARALLELISM OF LAYERS AND/OR ACHIEVING DESIRED THICKNESSES OF LAYERS DURING THE ELECTROCHEMICAL FABRICATION OF STRUCTURES

RELATED APPLICATION DATA

This application claims benefit of U.S. Provisional Patent Application Nos. 60/534,159 and 60/534,183, both filed Dec. 31, 2003. Each of these referenced applications are incorporated herein by reference.

FIELD OF THE INVENTION

The present invention relates generally to the field of Electrochemical Fabrication and the associated formation of three-dimensional structures (e.g. microscale or mesoscale structures). More particularly it relates to improved methods and apparatus for achieving a desired level of parallelism between layers and/or for achieving desired thicknesses of layers of the structures.

BACKGROUND OF THE INVENTION

A technique for forming three-dimensional structures (e.g. parts, components, devices, and the like) from a plurality of adhered layers was invented by Adam L. Cohen and is known as Electrochemical Fabrication. It is being commercially pursued by Microfabrica Inc. (formerly MEMGen® Corporation) of Burbank, Calif. under the name EFAB™. This technique was described in U.S. Pat. No. 6,027,630, issued on Feb. 22, 2000. This electrochemical deposition technique allows the selective deposition of a material using a unique masking technique that involves the use of a mask that includes patterned conformable material on a support structure that is independent of the substrate onto which plating will occur. When desiring to perform an electrodeposition using the mask, the conformable portion of the mask is brought into contact with a substrate while in the presence of a plating solution such that the contact of the conformable portion of the mask to the substrate inhibits deposition at selected locations. For convenience, these masks might be generically called conformable contact masks; the masking technique may be generically called a conformable contact mask plating process. More specifically, in the terminology of Microfabrica Inc. (formerly MEMGen® Corporation) of Burbank, Calif. such masks have come to be known as INSTANT MASKS™ and the process known as INSTANT MASKING™ or INSTANT MASK™ plating. Selective depositions using conformable contact mask plating may be used to form single layers of material or may be used to form multi-layer structures. The teachings of the '630 patent are hereby incorporated herein by reference as if set forth in full herein. Since the filing of the patent application that led to the above noted patent, various papers about conformable contact mask plating (i.e. INSTANT MASKING) and electrochemical fabrication have been published:

(1) A. Cohen, G. Zhang, F. Tseng, F. Mansfeld, U. Frodis and P. Will, "EFAB: Batch production of functional, fully-dense metal parts with micro-scale features", Proc. 9th Solid Freeform Fabrication, The University of Texas at Austin, p161, August 1998.

(2) A. Cohen, G. Zhang, F. Tseng, F. Mansfeld, U. Frodis and P. Will, "EFAB: Rapid, Low-Cost Desktop Micro-machining of High Aspect Ratio True 3-D MEMS", Proc. 12th IEEE Micro Electro Mechanical Systems Workshop, IEEE, p244, January 1999.

(3) A. Cohen, "3-D Micromachining by Electrochemical Fabrication", Micromachine Devices, March 1999.

(4) G. Zhang, A. Cohen, U. Frodis, F. Tseng, F. Mansfeld, and P. Will, "EFAB: Rapid Desktop Manufacturing of True 3-D Microstructures", Proc. 2nd International Conference on Integrated MicroNanotechnology for Space Applications, The Aerospace Co., April 1999.

(5) F. Tseng, U. Frodis, G. Zhang, A. Cohen, F. Mansfeld, and P. Will, "EFAB: High Aspect Ratio, Arbitrary 3-D Metal Microstructures using a Low-Cost Automated Batch Process", 3rd International Workshop on High Aspect Ratio MicroStructure Technology (HARMST'99), June 1999.

(6) A. Cohen, U. Frodis, F. Tseng, G. Zhang, F. Mansfeld, and P. Will, "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, September 1999.

(7) F. Tseng, G. Zhang, U. Frodis, A. Cohen, F. Mansfeld, and P. Will, "EFAB: High Aspect Ratio, Arbitrary 3-D Metal Microstructures using a Low-Cost Automated Batch Process", MEMS Symposium, ASME 1999 International Mechanical Engineering Congress and Exposition, November, 1999.

(8) A. Cohen, "Electrochemical Fabrication (EFAB™)", Chapter 19 of The MEMS Handbook, edited by Mohamed Gad-EI-Hak, CRC Press, 2002.

(9) Microfabrication—Rapid Prototyping's Killer Application", pages 1-5 of the Rapid Prototyping Report, CAD/CAM Publishing, Inc., June 1999.

The disclosures of these nine publications are hereby incorporated herein by reference as if set forth in full herein.

The electrochemical deposition process may be carried out in a number of different ways as set forth in the above patent and publications. In one form, this process involves the execution of three separate operations during the formation of each layer of the structure that is to be formed:

1. Selectively depositing at least one material by electrodeposition upon one or more desired regions of a substrate.

2. Then, blanket depositing at least one additional material by electrodeposition so that the additional deposit covers both the regions that were previously selectively deposited onto, and the regions of the substrate that did not receive any previously applied selective depositions.

3. Finally, planarizing the materials deposited during the first and second operations to produce a smoothed surface of a first layer of desired thickness having at least one region containing the at least one material and at least one region containing at least the one additional material.

After formation of the first layer, one or more additional layers may be formed adjacent to the immediately preceding layer and adhered to the smoothed surface of that preceding layer. These additional layers are formed by repeating the first through third operations one or more times wherein the formation of each subsequent layer treats the previously formed layers and the initial substrate as a new and thickening substrate.

Once the formation of all layers has been completed, at least a portion of at least one of the materials deposited is generally removed by an etching process to expose or release the three-dimensional structure that was intended to be formed.

The preferred method of performing the selective electrodeposition involved in the first operation is by conformable contact mask plating. In this type of plating, one or more conformable contact (CC) masks are first formed. The CC masks include a support structure onto which a patterned conformable dielectric material is adhered or formed. The conformable material for each mask is shaped in accordance with a particular cross-section of material to be plated. At least one CC mask is needed for each unique cross-sectional pattern that is to be plated.

The support for a CC mask is typically a plate-like structure formed of a metal that is to be selectively electroplated and from which material to be plated will be dissolved. In this typical approach, the support will act as an anode in an electroplating process. In an alternative approach, the support may instead be a porous or otherwise perforated material through which deposition material will pass during an electroplating operation on its way from a distal anode to a deposition surface. In either approach, it is possible for CC masks to share a common support, i.e. the patterns of conformable dielectric material for plating multiple layers of material may be located in different areas of a single support structure. When a single support structure contains multiple plating patterns, the entire structure is referred to as the CC mask while the individual plating masks may be referred to as "submasks". In the present application such a distinction will be made only when relevant to a specific point being made.

In preparation for performing the selective deposition of the first operation, the conformable portion of the CC mask is placed in registration with and pressed against a selected portion of the substrate (or onto a previously formed layer or onto a previously deposited portion of a layer) on which deposition is to occur. The pressing together of the CC mask and substrate occur in such a way that all openings, in the conformable portions of the CC mask contain plating solution. The conformable material of the CC mask that contacts the substrate acts as a barrier to electrodeposition while the openings in the CC mask that are filled with electroplating solution act as pathways for transferring material from an anode (e.g. the CC mask support) to the non-contacted portions of the substrate (which act as a cathode during the plating operation) when an appropriate potential and/or current are supplied.

An example of a CC mask and CC mask plating are shown in FIGS. 1A-1C. FIG. 1A shows a side view of a CC mask 8 consisting of a conformable or deformable (e.g. elastomeric) insulator 10 patterned on an anode 12. The anode has two functions. FIG. 1A also depicts a substrate 6 separated from mask 8. One is as a supporting material for the patterned insulator 10 to maintain its integrity and alignment since the pattern may be topologically complex (e.g., involving isolated "islands" of insulator material). The other function is as an anode for the electroplating operation. CC mask plating selectively deposits material 22 onto a substrate 6 by simply pressing the insulator against the substrate then electrodepositing material through apertures 26a and 26b in the insulator as shown in FIG. 1B. After deposition, the CC mask is separated, preferably non-destructively, from the substrate 6 as shown in FIG. 1C. The CC mask plating process is distinct from a "through-mask" plating process in that in a through-mask plating process the separation of the masking material from the substrate would occur destructively. As with through-mask plating, CC mask plating deposits material selectively and simultaneously over the entire layer. The plated region may consist of one or more isolated plating regions where these isolated plating regions may belong to a single structure that is being formed or may belong to multiple structures that are being formed simultaneously. In CC mask plating as individual masks are not intentionally destroyed in the removal process, they may be usable in multiple plating operations.

Another example of a CC mask and CC mask plating is shown in FIGS. 1D-1F. FIG. 1D shows an anode 12' separated from a mask 8' that includes a patterned conformable material 10' and a support structure 20. FIG. 1D also depicts substrate 6 separated from the mask 8'. FIG. 1E illustrates the mask 8' being brought into contact with the substrate 6. FIG. 1F illustrates the deposit 22' that results from conducting a current from the anode 12' to the substrate 6. FIG. 1G illustrates the deposit 22' on substrate 6 after separation from mask 8'. In this example, an appropriate electrolyte is located between the substrate 6 and the anode 12' and a current of ions coming from one or both of the solution and the anode are conducted through the opening in the mask to the substrate where material is deposited. This type of mask may be referred to as an anodeless INSTANT MASK™ (AIM) or as an anodeless conformable contact (ACC) mask.

Unlike through-mask plating, CC mask plating allows CC masks to be formed completely separate from the fabrication of the substrate on which plating is to occur (e.g. separate from a three-dimensional (3D) structure that is being formed). CC masks may be formed in a variety of ways, for example, a photolithographic process may be used. All masks can be generated simultaneously, prior to structure fabrication rather than during it. This separation makes possible a simple, low-cost, automated, self-contained, and internally-clean "desktop factory" that can be installed almost anywhere to fabricate 3D structures, leaving any required clean room processes, such as photolithography to be performed by service bureaus or the like.

An example of the electrochemical fabrication process discussed above is illustrated in FIGS. 2A-2F. These figures show that the process involves deposition of a first material 2 which is a sacrificial material and a second material 4 which is a structural material. The CC mask 8, in this example, includes a patterned conformable material (e.g. an elastomeric dielectric material) 10 and a support 12 which is made from deposition material 2. The conformal portion of the CC mask is pressed against substrate 6 with a plating solution 14 located within the openings 16 in the conformable material 10. An electric current, from power supply 18, is then passed through the plating solution 14 via (a) support 12 which doubles as an anode and (b) substrate 6 which doubles as a cathode. FIG. 2A, illustrates that the passing of current causes material 2 within the plating solution and material 2 from the anode 12 to be selectively transferred to and plated on the cathode 6. After electroplating the first deposition material 2 onto the substrate 6 using CC mask 8, the CC mask 8 is removed as shown in FIG. 2B. FIG. 2C depicts the second deposition material 4 as having been blanket-deposited (i.e. non-selectively deposited) over the previously deposited first deposition material 2 as well as over the other portions of the substrate 6. The blanket deposition occurs by electroplating from an anode (not shown), composed of the second material, through an appropriate plating solution (not shown), and to the cathode/substrate 6. The entire two-material layer is then planarized to achieve precise thickness and flatness as shown in FIG. 2D. After repetition of this process for all layers, the multi-layer structure 20 formed of the second material 4 (i.e. structural material) is embedded in first material 2 (i.e. sacrificial material) as shown in FIG. 2E. The embedded structure is etched to yield the desired device, i.e. structure 20, as shown in FIG. 2F.

Various components of an exemplary manual electrochemical fabrication system 32 are shown in FIGS. 3A-3C. The system 32 consists of several subsystems 34, 36, 38, and 40. The substrate holding subsystem 34 is depicted in the upper portions of each of FIGS. 3A to 3C and includes several components: (1) a carrier 48, (2) a metal substrate 6 onto which the layers are deposited, and (3) a linear slide 42 capable of moving the substrate 6 up and down relative to the carrier 48 in response to drive force from actuator 44. Subsystem 34 also includes an indicator 46 for measuring differences in vertical position of the substrate which may be used in setting or determining layer thicknesses and/or deposition thicknesses. The subsystem 34 further includes feet 68 for carrier 48 which can be precisely mounted on subsystem 36.

The CC mask subsystem 36 shown in the lower portion of FIG. 3A includes several components: (1) a CC mask 8 that is actually made up of a number of CC masks (i.e. submasks) that share a common supportanode 12, (2) precision X-stage 54, (3) precision Y-stage 56, (4) frame 72 on which the feet 68 of subsystem 34 can mount, and (5) a tank 58 for containing the electrolyte 16. Subsystems 34 and 36 also include appropriate electrical connections (not shown) for connecting to an appropriate power source for driving the CC masking process.

The blanket deposition subsystem 38 is shown in the lower portion of FIG. 3B and includes several components: (1) an anode 62, (2) an electrolyte tank 64 for holding plating solution 66, and (3) frame 74 on which the feet 68 of subsystem 34 may sit. Subsystem 38 also includes appropriate electrical connections (not shown) for connecting the anode to an appropriate power supply for driving the blanket deposition process.

The planarization subsystem 40 is shown in the lower portion of FIG. 3C and includes a lapping plate 52 and associated motion and control systems (not shown) for planarizing the depositions.

Another method for forming microstructures from electroplated metals (i.e. using electrochemical fabrication techniques) is taught in U.S. Pat. No. 5,190,637 to Henry Guckel, entitled "Formation of Microstructures by Multiple Level Deep X-ray Lithography with Sacrificial Metal layers". This patent teaches the formation of metal structure utilizing mask exposures. A first layer of a primary metal is electroplated onto an exposed plating base to fill a void in a photoresist, the photoresist is then removed and a secondary metal is electroplated over the first layer and over the plating base. The exposed surface of the secondary metal is then machined down to a height which exposes the first metal to produce a flat uniform surface extending across the both the primary and secondary metals. Formation of a second layer may then begin by applying a photoresist layer over the first layer and then repeating the process used to produce the first layer. The process is then repeated until the entire structure is formed and the secondary metal is removed by etching. The photoresist is formed over the plating base or previous layer by casting and the voids in the photoresist are formed by exposure of the photoresist through a patterned mask via X-rays or UV radiation.

Even though electrochemical fabrication as taught and practiced to date, has greatly enhanced the capabilities of microfabrication, and in particular added greatly to the number of metal layers that can be incorporated into a structure and to the speed and simplicity in which such structures can be made, room for enhancing the state of electrochemical fabrication exists. In particular, a need exists for enhanced techniques for determining completion of planarization operations (i.e. endpoint detection) and associated achievement of a layer thickness within a desired tolerance or of target structure height which is associated with the adding of a layer having a thickness equal to a layer thickness. Also a need exists for enhanced techniques for determining the parallelness of a deposited layer relative to a previously deposited layer or to the substrate.

SUMMARY OF THE INVENTION

It is an object of one or more embodiments of the invention to provide a substrate modification technique that includes an improved endpoint detection method and apparatus.

It is an object of one or more embodiments of the invention to provide a substrate modification technique that includes an improved parallelism maintenance method and apparatus.

It is an object of one or more embodiments of the invention to provide a multi-layer electrochemical fabrication technique with an improved endpoint detection method and apparatus.

It is an object of one or more embodiments of the invention to provide a multi-layer electrochemical fabrication technique with an improved parallelism maintenance method and apparatus.

Other objects and advantages of various embodiments of the invention will be apparent to those of skill in the art upon review of the teachings herein. The various embodiments and aspects of the invention, set forth explicitly herein or otherwise ascertained from the teachings herein, may address one or more of the above objects alone or in combination, or alternatively may address some other object ascertained from the teachings herein. It is not necessarily intended that all objects be addressed by any single embodiment or aspect of the invention even though that may be the case with regard to some aspects.

In a first aspect of the invention a fabrication process for forming a multi-layer three-dimensional structure, comprising: (a) forming and adhering a layer of material to a previously formed layer and/or to a substrate, wherein the layer comprises a desired pattern of at least one material, wherein one or more contact pads exist on the substrate or on a previously formed layer; (b) subjecting the at least one material to a planarization operation; (c) locating a measurement probe in contact with the one or more contact pads and in contact with material that was subject to the planarization operation and extracting data from the fixture concerning a measured height of planarized material at at least one point relative to a desired reference point or plane; (d) comparing the measured height of material to a desired height for the material; (e) if the measured and desired heights are not within a desired tolerance, repeating operations (b)-(d) until the measured and desired heights are within the desired tolerance; (f) repeating the forming and adhering of operation (a) one or more times to form the three-dimensional structure from a plurality of adhered layers.

In a second aspect of the invention a fabrication process for forming a multi-layer three-dimensional structure, comprising: (a) forming and adhering a layer of material to a previously formed layer and/or to a substrate, wherein the layer comprises a desired pattern of at least one material; (b) subjecting the at least one material to a planarization operation, comprising: (i) mounting the substrate to a lapping fixture via a porous vacuum chuck; (ii) while the substrate is mounted to the fixture, subjecting the deposited material to a lapping operation to planarize a surface of the material and to bring the height of deposited material to a desired value; (c) repeating the forming and adhering of operation (a) one or more times to form the three-dimensional structure from a plurality of adhered layers.

In a third aspect of the invention a fabrication process for forming a multi-layer three-dimensional structure, comprising: (a) forming and adhering a layer of material to a previously formed layer and/or to a substrate, wherein the layer comprises a desired pattern of at least one material, wherein one or more contact pads exist on the substrate or on a previously formed layer; (b) subjecting the at least one material to a planarization operation, comprising: (i) mounting the substrate to a lapping fixture via a porous vacuum chuck; (ii) while the substrate is mounted to the fixture, subjecting the deposited material to a lapping operation to planarize a surface of the material and to bring the height of deposited material to a desired value;(c) locating a fixture in contact with the one or more contact pads and in contact with material that was subject to the planarization operation and extracting data from the fixture concerning a measured height of planarized material at at least one point relative to a desired reference point or plane; (d) comparing the measured height of material to a desired height for the material; (e) if the measured and desired heights are not within a desired tolerance, repeating operations (b)-(d) until the measured and desired heights are within the desired tolerance; (f) repeating the forming and adhering of operation (a) one or more times to form the three-dimensional structure from a plurality of adhered layers.

In a fourth aspect of the invention a fabrication process for forming a multi-layer three-dimensional structure, comprising: (a) forming and adhering a layer of material to a previously formed layer and/or to a substrate, wherein the layer comprises a desired pattern of at least one material, wherein one or more contact pads exist on the substrate or on a previously formed layer; (b) subjecting the at least one material to a planarization operation, comprising: (i) mounting the substrate to a lapping fixture via a porous vacuum chuck; (ii) while the substrate is mounted to the fixture, subjecting the deposited material to a lapping operation to planarize a surface of the material and to bring the height of deposited material to a desired value; (c) repeating the forming and adhering of operation (a) one or more times to form the three-dimensional structure from a plurality of adhered layers.

In a fifth aspect of the invention a fabrication process for forming a multi-layer three-dimensional structure, comprising: (a) forming and adhering a layer of material to a previously formed layer and/or to a substrate, wherein the layer comprises a desired pattern of at least one material, wherein one or more contact pads exist on the substrate or on a previously formed layer; (b) subjecting the at least one material to a planarization operation; (c) subjecting the at least one material to inspection to determine at least two of the height of the deposition relative to a desired reference, the planarity of the deposition, and the orientation of the deposition relative to a desired reference; (d) repeating the forming and adhering of operation (a) one or more times to form the three-dimensional structure from a plurality of adhered layers.

In a sixth aspect of the invention a fabrication process for forming a multi-layer three-dimensional structure, comprising: (a) forming and adhering a layer of material to a previously formed layer and/or to a substrate, wherein the layer comprises a desired pattern of at least one material, wherein one or more reference pads exist on the substrate or on a previously formed layer which may be used in ascertaining at least one of the height of deposition of a planarized deposited material, the planarity of the planarized material, and/or the orientation of the planed material; (b) repeating the forming and adhering of operation (a) one or more times to form the three-dimensional structure from a plurality of adhered layers.

In a seventh aspect of the invention a fabrication process for forming a multi-layer three-dimensional structure, comprising: (a) forming and adhering a layer of material to a previously formed layer and/or to a substrate, wherein the layer comprises a desired pattern of at least one material; (b) subjecting the at least one material to a planarization operation, comprising: (i) mounting the substrate to a fixture in a fly cutting machine; (ii) while the substrate is mounted to the fixture, subjecting the deposited material to a rotating cutting tool to planarize a surface of the material and to bring the height of deposited material to a desired value; (c) repeating the forming and adhering of operation (a) one or more times to form the three-dimensional structure from a plurality of adhered layers.

In an eighth aspect of the invention a fabrication process for forming a multi-layer three-dimensional structure, comprising: (a) forming and adhering a layer of material to a previously formed layer and/or to a substrate, wherein the layer comprises a desired pattern of at least one material, wherein one or more contact pads exist on the substrate or on a previously formed layer; (b) subjecting the at least one material to a planarization operation, comprising: (i) mounting the substrate to a fixture in a fly cutting machine; (ii) while the substrate is mounted to the fixture, subjecting the deposited material to a rotating cutting tool to planarize a surface of the material and to bring the height of deposited material to a desired value; (c) locating a fixture in contact with the one or more contact pads and in contact with material that was subject to the planarization operation and extracting data from the fixture concerning a measured height of planarized material at at least one point relative to a desired reference point or plane; (d) comparing the measured height of material to a desired height for the material; (e) if the measured and desired heights are not within a desired tolerance, repeating operations (b)-(d) until the measured and desired heights are within the desired tolerance; (f) repeating the forming and adhering of operation (a) one or more times to form the three-dimensional structure from a plurality of adhered layers.

In a ninth aspect of the invention a fabrication process for forming a multi-layer three-dimensional structure, comprising: (a) forming and adhering a layer of material to a previously formed layer and/or to a substrate, wherein the layer comprises a desired pattern of at least one material, wherein one or more contact pads exist on the substrate or on a previously formed layer; (b) subjecting the at least one material to a planarization operation, comprising: (i) mounting the substrate to a fixture in a fly cutting machine, wherein the fixture has the capability of adjusting the plane of the substrate relative to a cutting plane of the fly cutting machine; (ii) adjusting the plane of the substrate to match the plane of cutting on the fly cutting machine; and then (ii) while the substrate is mounted to the fixture, subjecting the deposited material to a rotating cutting tool to planarize a surface of the material to bring the height of deposited material to a desired value; (c) repeating the forming and adhering of operation (a) one or more times to form the three-dimensional structure from a plurality of adhered layers.

Further aspects of the invention will be understood by those of skill in the art upon reviewing the teachings herein. Other aspects of the invention may involve apparatus that can be used in implementing one or more of the above method aspects of the invention. Even further aspects of the invention may provide various combinations of the aspects presented above as well as provide other configurations, structures, functional relationships, and processes that have not been specifically set forth above. Still further aspects of the invention may provide apparatus for planarizing deposits of materials located on substrates while even further aspects may provide fixtures for use in such apparatus.

BRIEF DESCRIPTION OF THE DRAWINGS

FIGS. 5B-5G provide examples of operation sets that may be used in conjunction with the process of FIG. 5A or in conjunction with other processes.

DETAILED DESCRIPTION OF PREFERRED EMBODIMENTS OF THE INVENTION

FIGS. 1A-1G, 2A-2F, and 3A-3C illustrate various features of one form of electrochemical fabrication that are known. Other electrochemical fabrication techniques are set forth in the '630 patent referenced above, in the various previously incorporated publications, in various other patents and patent applications incorporated herein by reference, still others may be derived from combinations of various approaches described in these publications, patents, and applications, or are otherwise known or ascertainable by those of skill in the art from the teachings set forth herein. All of these techniques may be combined with those of the various embodiments of various aspects of the invention to yield enhanced embodiments. Still other embodiments may be derived from combinations of the various embodiments explicitly set forth herein.

Figure 1A:
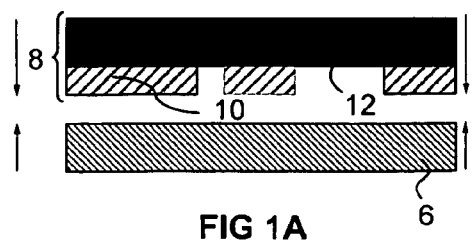
FIGS. 1A-1C schematically depict side views of various stages of a CC mask plating process, while FIGS. 1D-G schematically depict a side views of various stages of a CC mask plating process using a different type of CC mask.
Figure 1B:
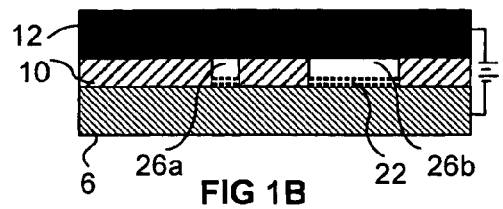
Figure 1C:
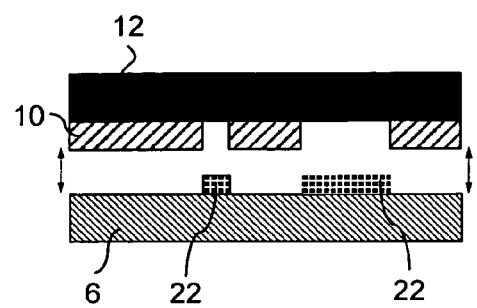
Figure 1D:
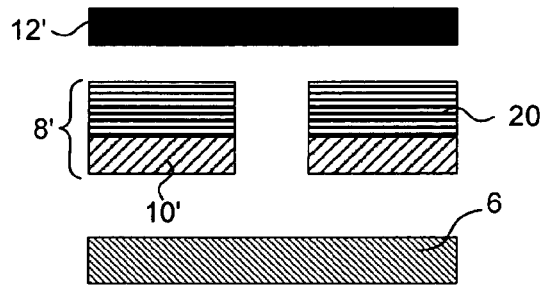
Figure 1E:
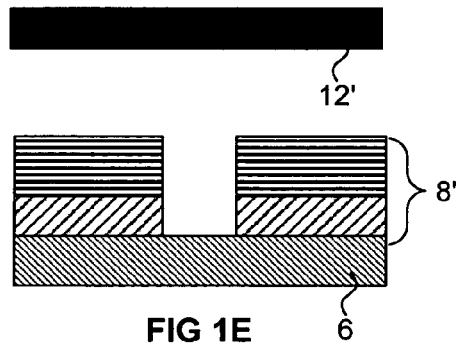
Figure 1F:
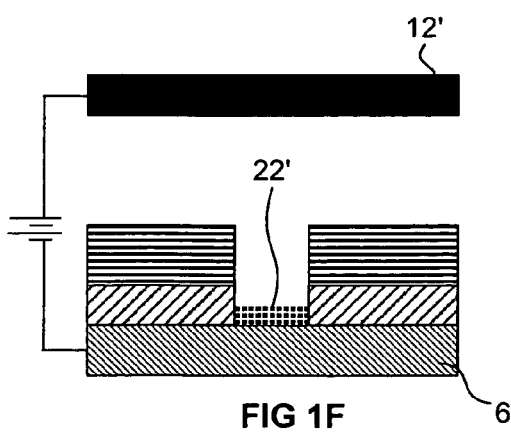
Figure 1G:
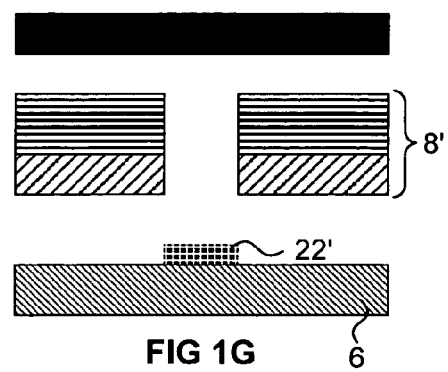
Figure 2A:
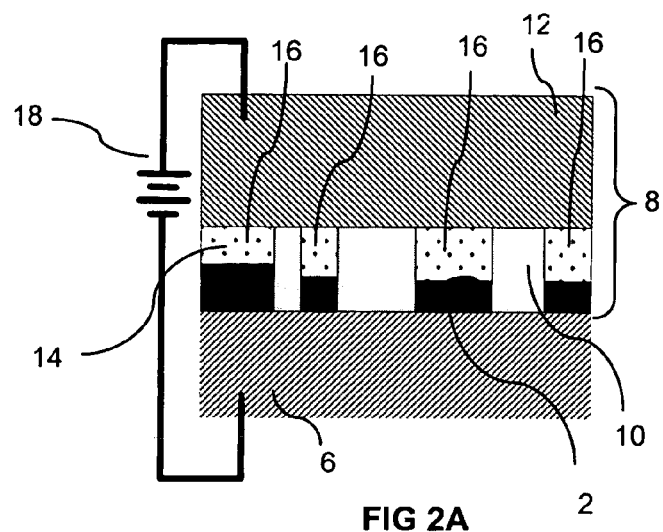
FIGS. 2A-2F schematically depict side views of various stages of an electrochemical fabrication process as applied to the formation of a particular structure where a sacrificial material is selectively deposited while a structural material is blanket deposited.
Figure 2B:
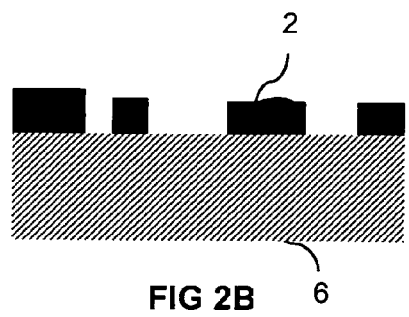
Figure 2C:
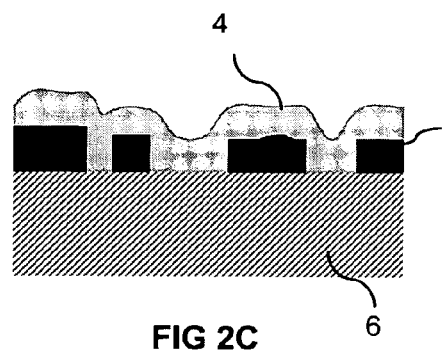
Figure 2D:
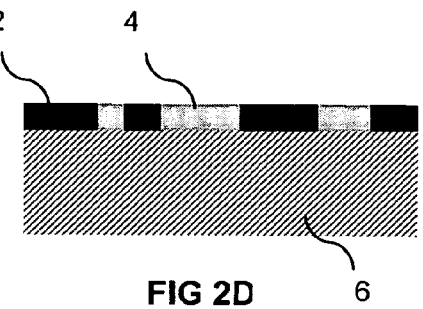
Figure 2E:
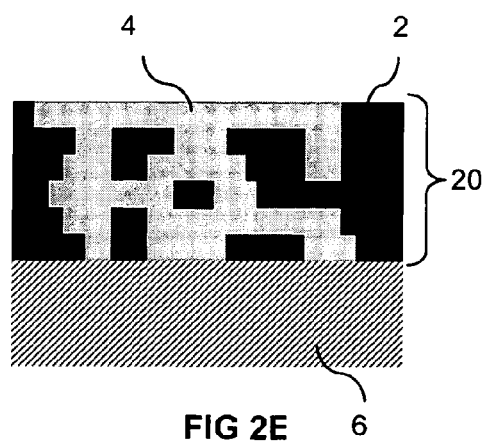
Figure 2F:
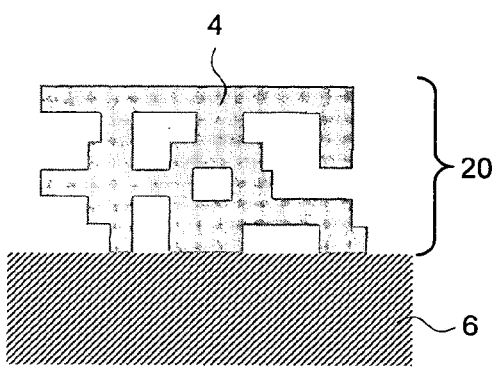
Figure 3A:
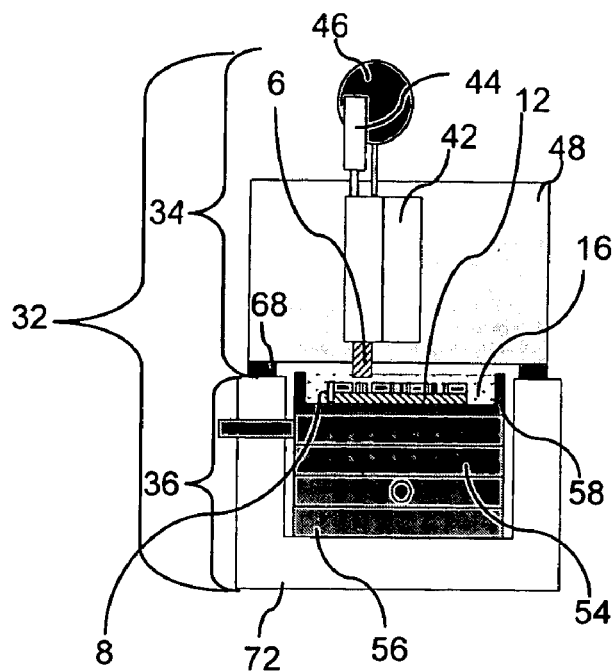
FIGS. 3A-3C schematically depict side views of various example subassemblies that may be used in manually implementing the electrochemical fabrication method depicted in FIGS. 2A-2F.
Figure 3B:
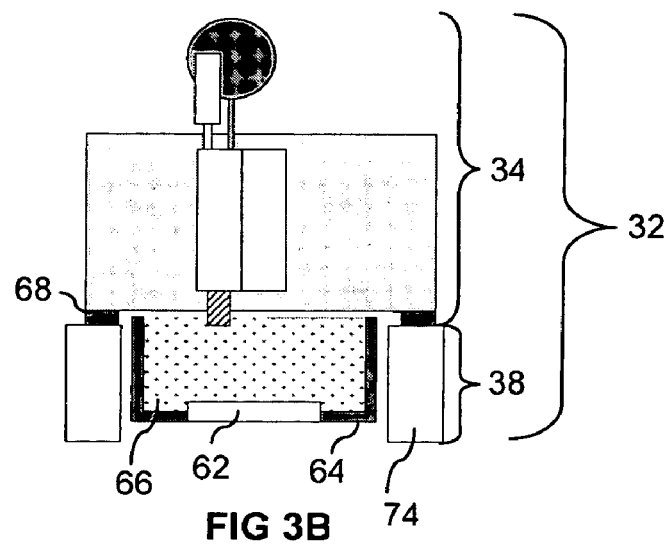
Figure 3C:
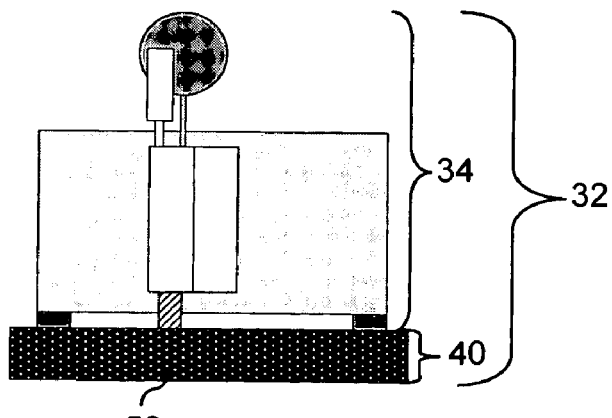
Figure 4A:
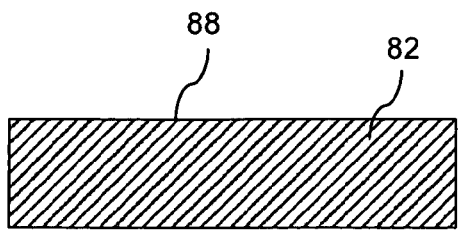
FIGS. 4A-4I schematically depict the formation of a first layer of a structure using adhered mask plating where the blanket deposition of a second material overlays both the openings between deposition locations of a first material and the first material itself.
Figure 4B:
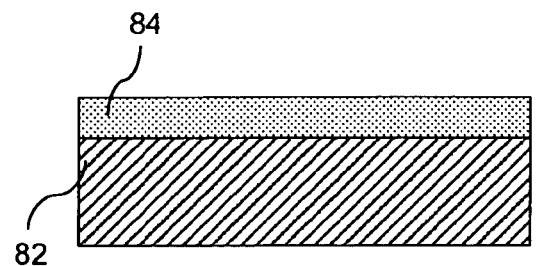
Figure 4C:
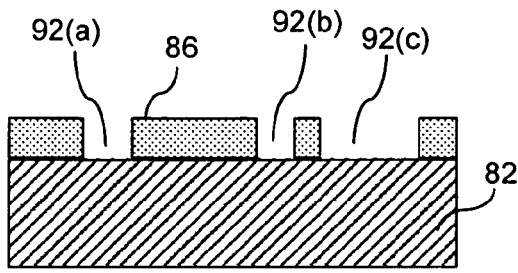
Figure 4D:
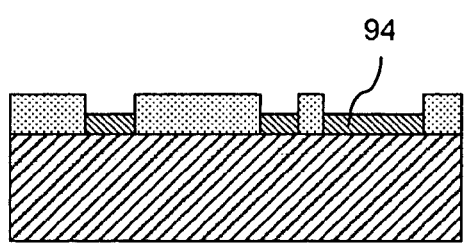
Figure 4E:
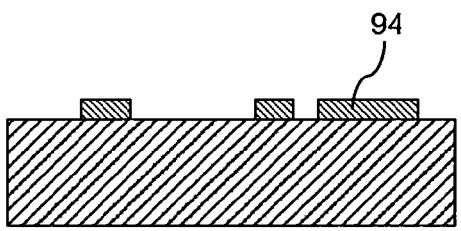
Figure 4F:
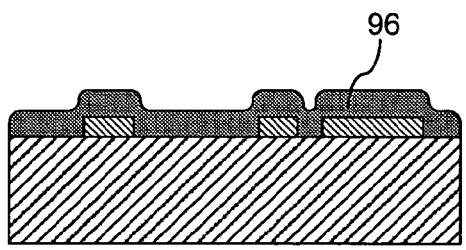
Figure 4G:
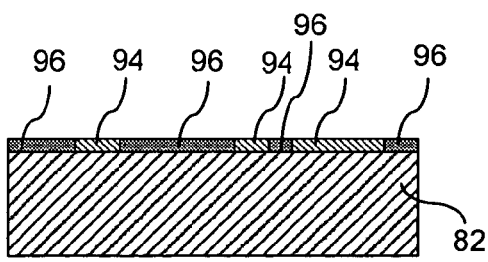
Figure 4H:
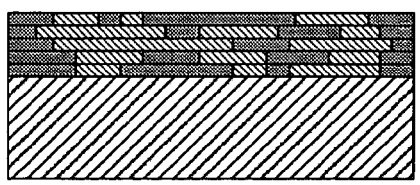
Figure 4I:
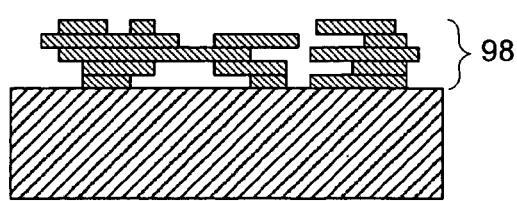

FIGS. 4A-4I illustrate various stages in the formation of a single layer of a multi-layer fabrication process where a second metal is deposited on a first metal as well as in openings in the first metal where its deposition forms part of the layer. In FIG. 4A, a side view of a substrate 82 is shown, onto which patternable photoresist 84 is cast as shown in FIG. 4B. In FIG. 4C, a pattern of resist is shown that results from the curing, exposing, and developing of the resist. The patterning of the photoresist 84 results in openings or apertures 92(*a*)-92(*c*) extending from a surface 86 of the photoresist through the thickness of the photoresist to surface 88 of the substrate 82. In FIG. 4D, a metal 94 (e.g. nickel) is shown as having been electroplated into the openings 92(*a*)-92(*c*). In FIG. 4E, the photoresist has been removed (i.e. chemically stripped) from the substrate to expose regions of the substrate 82 which are not covered with the first metal 94. In FIG. 4F, a second metal 96 (e.g., silver) is shown as having been blanket electroplated over the entire exposed portions of the substrate 82 (which is conductive) and over the first metal 94 (which is also conductive). FIG. 4G depicts the completed first layer of the structure which has resulted from the planarization of the first and second metals down to a height that exposes the first metal and sets a thickness for the first layer. In FIG. 4H the result of repeating the process steps shown in FIGS. 4B-4G several times to form a multi-layer structure are shown where each layer consists of two materials. For most applications, one of these materials is removed as shown in FIG. 4I to yield a desired 3-D structure 98 (e.g. component or device).

The various embodiments, alternatives, and techniques disclosed herein may form multi-layer structures using a single patterning technique on all layers or using different patterning techniques on different layers. For example, different types of patterning masks and masking techniques may be used or even techniques that perform direct selective depositions without the need for masking. For example, conformable contact masks or non-conformable contact masks may be used on different layers. Proximity masks and masking operations (i.e. operations that use masks that at least partially selectively shield a substrate by their proximity to the substrate even if contact is not made) may be used, and adhered masks and masking operations (masks and operations that use masks that are adhered to a substrate onto which selective deposition or etching is to occur as opposed to only being contacted to it) may be used.

Some embodiments of the present invention provide processes and apparatus for electrochemically fabricating multilayer structures (e.g. mesoscale or microscale structures) with improved endpoint detection and parallelism maintenance for materials (e.g. layers) that are planarized during the electrochemical fabrication process. Some methods involve the use of a fixture during planarization that ensures that planarized planes of material are parallel to other planarized depositions of material within a given tolerance. Some methods involve the use of an endpoint detection fixture that ensures precise heights of deposited materials relative to an initial surface of a substrate, relative to a first deposited layer, or relative to some other layer formed during the fabrication process. In some embodiments planarization may occur via lapping and planarization fixtures may include a porous graphite vacuum chuck that is mounted on a stage that is movable perpendicular to a plane defined by wear pads on which the fixture rests during lapping operations. In some embodiments, the end-pointing fixture may include three or more legs of fixed length and one or more (e.g. 3-4) height measuring probes. The use of the fixture may include contacting the legs against exposed pads on a surface of the substrate and then adjusting the positions of contact elements of the height measuring probes until contact is made with the deposit that is to be measured. The height difference registered by the probes between a zeroing or a calibration measurement and the deposit measurement is indicative of the deposit height and possibly of the orientation of the plane of the deposit and/or possibly the planarity of the deposit. In some embodiments, corrective actions may be taken if planarization height, planarity, and/or orientation are out of a desired tolerance range.

FIG. 5 provides a flowchart of a method for forming a multilayer three-dimensional structure according to a first embodiment of the invention which uses an end-pointing fixture and a planarization fixture.

Block 102 of FIG. 5 calls for the supplying of a planarization fixture that may be used for holding the substrate and any deposited materials thereon during planarization operations. Block 104 calls for the preparing of the planarization fixture for use. This preparation may involve the planarization of a chuck that is used for holding the substrate so that it achieves a surface which is parallel to the surface of positioning pads on which the fixture sets during planarization (i.e. lapping) operations.

Block 106 calls for the supplying of an endpoint detection fixture while block 108 calls for the preparation of the fixture so that it may be put to use. The preparation may involve setting the fixture on a flat surface and then zeroing the outputs of one or more detection probes when those probes contact the same flat surface that fixed length standoffs of the apparatus rest upon.

The preparation operations 104 and 108 may occur at the initiation of a build process or alternatively may occur periodically throughout a build process. For example, zeroing of the probes on an end-point detection apparatus may occur prior to each use of the end-point detection fixture.

The build process begins with block 112 and then moves forward to block 114 which calls for the defining of a couple of variables and parameters. In particular a current layer number variable, "n", is defined; a final layer number parameter, "N", is defined; an operation number variable for layer n, "on", is defined; and a final operation number parameter for layer N, "On", is defined. After definition of variables and parameters the process moves forward to block 116 which calls for the supplying of a substrate on which the structure is to be formed.

Next the process moves forward to block 118 which sets the current layer number variable n equal to one (n=1) and then moves forward to block 120 which sets the current operation number variable for layer n equal to one (on=1).

Next the process moves forward to block 124 which inquires as to whether the current operation (associated with on) is a planarization operation. If the answer is "no" the process moves forward to block 126 which calls for the performance of operation on and thereafter the process moves forward to block 148 which will be discussed herein later.

If the answer to the inquiry of decision block 124 is "yes" the process moves forward to block 128 which calls for the mounting of the substrate onto the planarization fixture which was prepared for operation in block 104.

Next the process moves forward to block 130 which calls for the performance of one or more planarization operations. These operations may, for example, be lapping operations with different types of abrasives and or contact pressures, lapping plate speeds and the like. After performance of the desired planarization operations the process moves forward to block 132 which calls for the making of an end point detection measurement using the end point detection fixture. In variations of the present embodiment, a different planarization fixture might be used and planarization operations other than lapping may be performed, for example, in some alternative embodiments, rough machining may be performed and or precision diamond machining (diamond turning or fly cutting) may be performed.

Next, the process moves forward to block 134 which calls for the analyzing of the data that results from the end-point detection measurement. This analysis may simply include comparing a measured value to a target value and then making a decision concerning subsequent operations based on that comparison.

Alternatively, the analysis may involve a more complex mathematical analysis of a plurality of measured data points, such as that which would derive a plane from a least squares fit of the data. The analysis may subsequently involve the comparison of the derived plane to an intended height of a plane to determination as to whether or not a target height has been achieved. The analysis may also involve a determination of the parallelness of the determined plane to that of a desired plane to determine whether or not a desired parallelness spec has been met. Further more the analysis may involve a determination of whether or not the planarity of the surface meets a defined specification.

After analysis has been performed the process moves forward to block 136 which inquires as to whether the desired objective or objectives have been achieved. If this inquiry produces a negative response, the process moves forward to block 138 which inquires as to whether or not further planarization will yield the desired objective. If the answer to the inquiry of block 138 is "yes", the process loops back to block 130 so that additional planarization operations may be performed. In some implementations of the embodiment the planarization parameters and even planarization process itself may be changed based on the analysis of block 134 during this second or subsequent loop through the planarization processes. If block 138 produces a negative response, the process moves forward to block 140 which calls for the taking of one of three actions: (1) institute remedial action and then jump to any appropriate point in the process to continue the build, (2) ignore the failure and continue the process, or (3) abort the build process and restart the build if desired. If the inquiry of block 136 produces a positive response or if the second option of block 140 is chosen the process moves forward to block 142.

Block 142 inquires as to whether or not another planarization operation is to be performed. If the response to this inquiry is "no" the process moves to block 146 which calls for the removal of the substrate from the planarization fixture. After removal of the substrate from the planarization fixture, the process moves forward to block 148.

In some implementations, multiple planarization operations may be called for to achieve a desired objective (e.g. initially perform lapping with a coarse slurry and then after a preliminary objective is met perform additional lapping with a finer slurry). In such implementations, the inquiry of block 142 may produce a positive response one or more times. In such an event, the process moves forward to block 144 which calls for the incrementing of the operation number by one (on=on +1) and then the process loops back to block 130 which calls for the performance of additional planarization operations. In this second or subsequent loop through the planarization process, the planarization variables, parameters, and even planarization process as a whole may be changed.

Once a negative response to the inquiry of block 142 is obtained the substrate is removed as called for in block 146 (as noted above) and then the process moves forward to block 148. As also noted previously, block 148 is also accessed after the performance of operation on called for in block 126 where in that case operation on was not a planarization operation.

Block 148 calls for incrementing the operation number variable by one (on=on +1) and then the process moves forward to block 150 which inquires as to whether the current operation number variable is greater than the final operation number parameter associated with layer n. If this inquiry produces a negative response the process loops back to block 124 so that another operation associated with layer n may be performed. If the inquiry of block 150 produces a positive response the layer number variable n is incremented by one (n=n +1) and then the process moves forward to block 154.

Block 154 inquires as to whether or not the current layer number variable n is greater then the final layer number parameter N (n>N?). If the answer to this inquiry is "yes" the formation of all layers has been completed and the process moves forward to block 156 and ends. If the answer is "no" the process loops back to block 120 and performance of operations for a next layer begins.

Block 156 calls for the ending of the layer formation process for the structure but not necessarily ending of the over all process of forming the structure. Various post processing operations may be performed to complete the formation of the desired structure as is more fully discussed elsewhere herein and in various patent applications that have been incorporated herein by reference.

FIGS. 5B-5G provide examples of various sets of operations that may be used in formation of individual layers of structures. In some embodiments the operations of a single figure may be repeated for the formation of each layer of a structure while in other embodiments the formation of different layers may involve the operations outlined in different figures. In other embodiments other layer formation operations may be used and/or additional layer formation operations may be used.

Figure 5A:
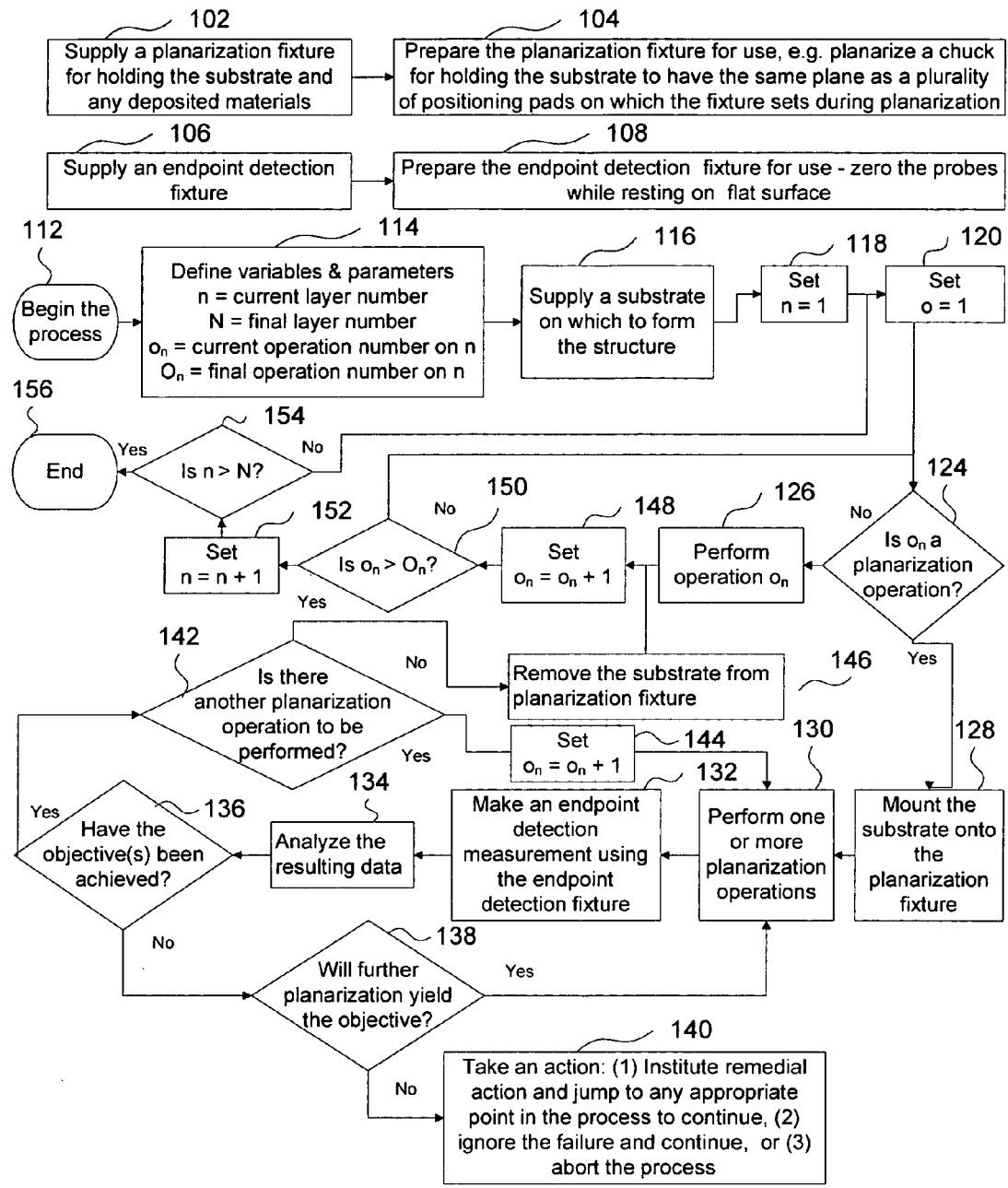
FIG. 5A provides a flowchart of a method for forming a multilayer three-dimensional structure according to a first embodiment of the invention which uses an end-pointing fixture and a separate planarization fixture.
Figure 5E:
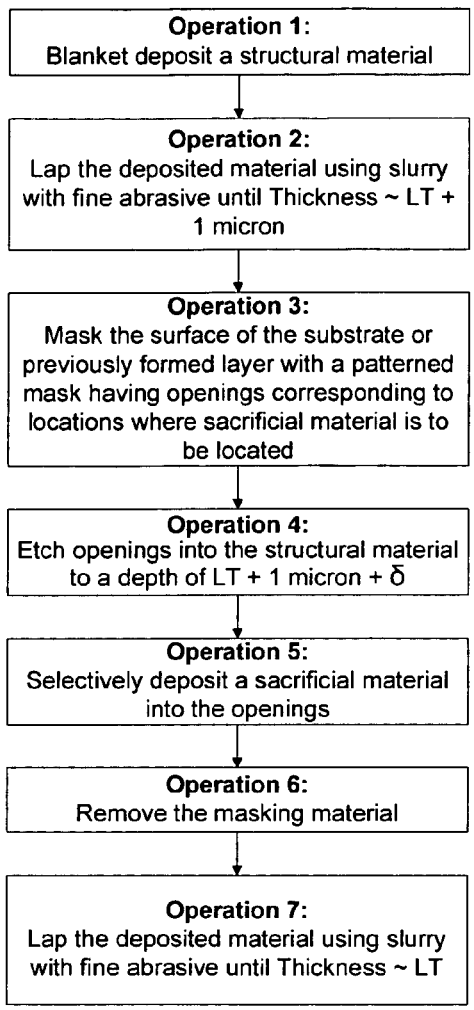
Figure 5F:
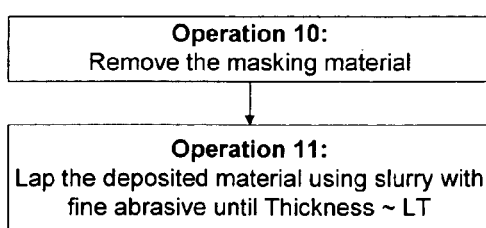
Figure 5F:
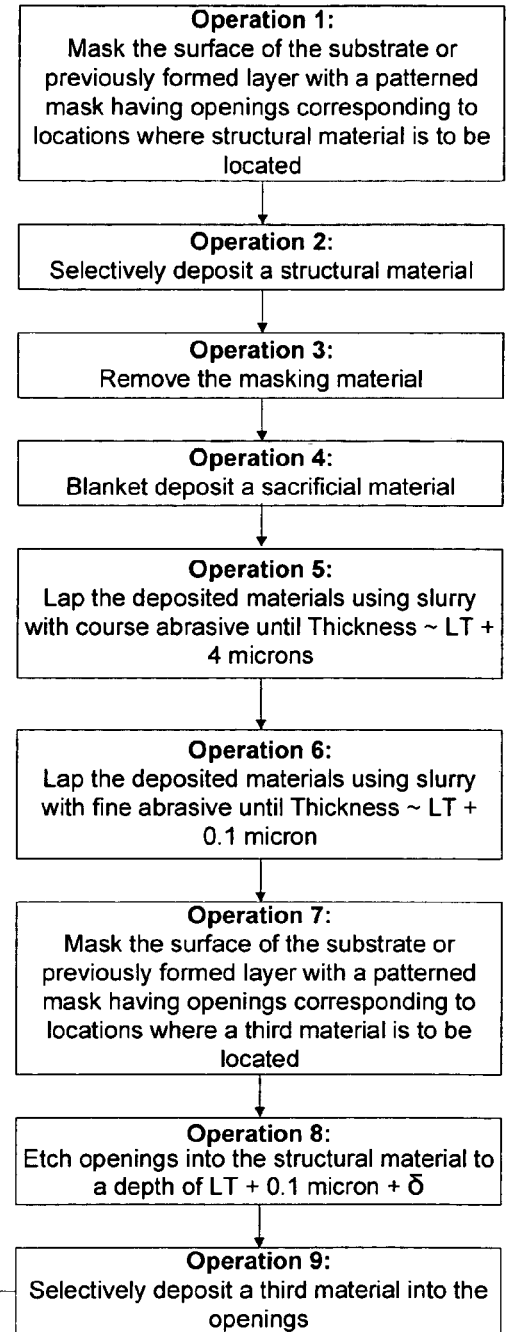
Figure 5G:
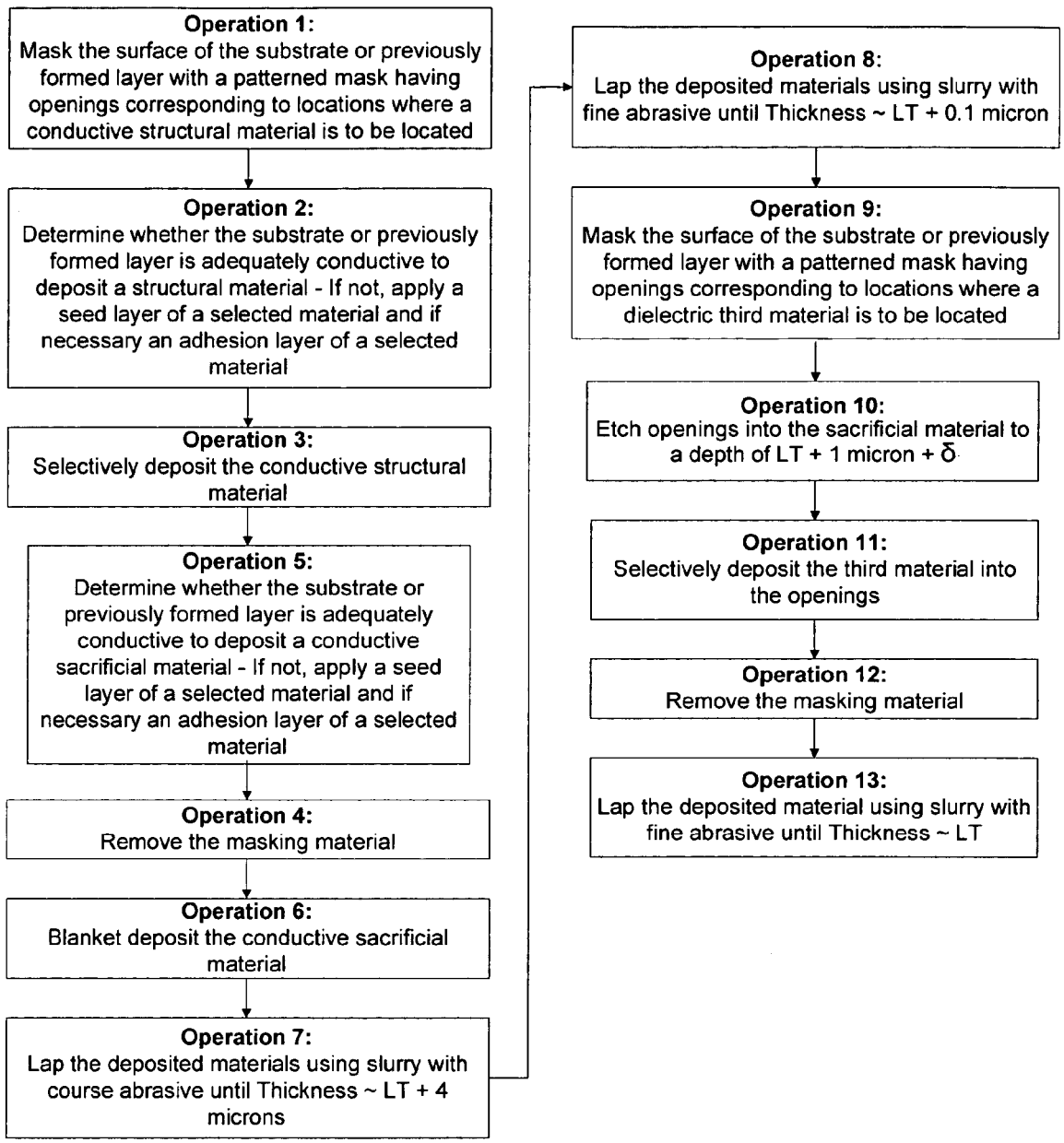

The process outlined in FIG. 5A may be modified in many different ways and may be implemented using different apparatus components. The process may be implemented in a single automatically controlled machine or it may be implemented using different machines where manual handling of the partially formed structures is used to transfer the structures between machines, to analyze acceptability of performed processes, and the like.

In some embodiments the invention may take the form of an apparatus (e.g. for example a fully automated or semi automated apparatus) for modifying a substrate or producing multilayer three-dimensional structures which for example may include (a) a substrate on which one or more successive depositions of one or more materials may have occurred and will occur; (b) a mask that comprises at least one void and at least one surrounding protrusion of material; (c) a stage for bringing the at least one protrusion of the mask into proximity to or into contact with the substrate so as to form at least one electrochemical process pocket having a desired registration with respect to any previous depositions and providing a desired electrolyte within the at least one electrochemical process pocket; (d) a power supply for applying a desired electrical activation between at least one electrode, that may be part of the mask or separate therefrom, and the substrate, such that a desired modification of the substrate occurs; (e) a planarization system (e.g. a lapping, fly cutting, or other mechanical or chemical-mechanical system) and detection system for trimming off excess material and for detecting when sufficient material has been removed; and in some embodiments (f) at least one controller for controlling the stage and the power supply.

In an alternative embodiment the mask of element (b) and the stage of element (c) may be replaced by an adhered mask placement (e.g. a laminator for dry film sheets or an applicator and spinner for liquid based resists), a patterning system (e.g. a selective exposure system that may use patterned photomask or a scanning laser beam and possibly a developer), and a removal system (e.g. a stripping solution, tank and/or sprayer, and the like).

The substrate may for example be in the form of a conductive material (e.g. a selected metal, or the like), a moderately conductive material (e.g. doped silicon, or the like), a dielectric or mixed dielectric/conductor/semiconductor base on which a conductive seed layer has been formed. The stage may include a linear stage driven by a linear motor or stepper motor or other rotary motor that drives a ball screw or other mechanism for translating rotational motion to linear motion, it may alternatively or additionally include a pressure driven expanding or collapsing bellows mechanism. The stage may include an encoder for position and it may include multiple stages such as course movement stages and fine movement stages. The stage may move on an air bearing or the like for smooth motion. It may allow linear motion in all three directions and/or rotational motion. In particular the stage may provide the ability to tilt either the substrate or a contact mask in order to achieve a desired amount of non-parallelness or non-planarity between the mating surface of the mask and that of the substrate. The power supply may take on any appropriate form required to drive the given reaction. For example, it may be a DC or pulsed DC supply; it may be controlled to output a fixed current or fixed voltage or a variable current or variable voltage. It may include feedback for accurate control. The controller may take a variety of forms. For example, it may be a computer that is programmed in a manner to control the other components in a desired way (e.g. to repeat operations a plurality of times to build up multi-layer structures) or it may be individual control elements for different apparatus components that are each controlled by an operator. The computer may include a monitor or other display and/or a printer for supplying information to an operator or user, a memory for storing recorded parameters and measurements, a keyboard, mouse, touch screen, or the like for accepting input from an operator. The computer may be connected to a network to allow remote control of the system or control of multiple systems from or by a single computer.

Many other apparatus components may also be incorporated into some embodiments: (1) a rigid frame for holding system components with appropriate accuracy and shielding panels for allowing a controlled environment to exist, (2) controlled air or gas systems, (3) temperature control systems, (4) substrate cleaning systems, (5) substrate activation systems, (6) plating systems and electrolyte replacement or cleaning systems, (7) air filters and circulation systems, (8) process monitoring equipment such as cameras, data acquisition and storage systems, (9) access doors and panels, (10) viewing windows or cameras and monitors, (11) operator warning systems, including lights and auditory signals, (12) heating systems for performing diffusion bonding, melting or flowing of selected building materials and the like, and the like.

Figure 6:
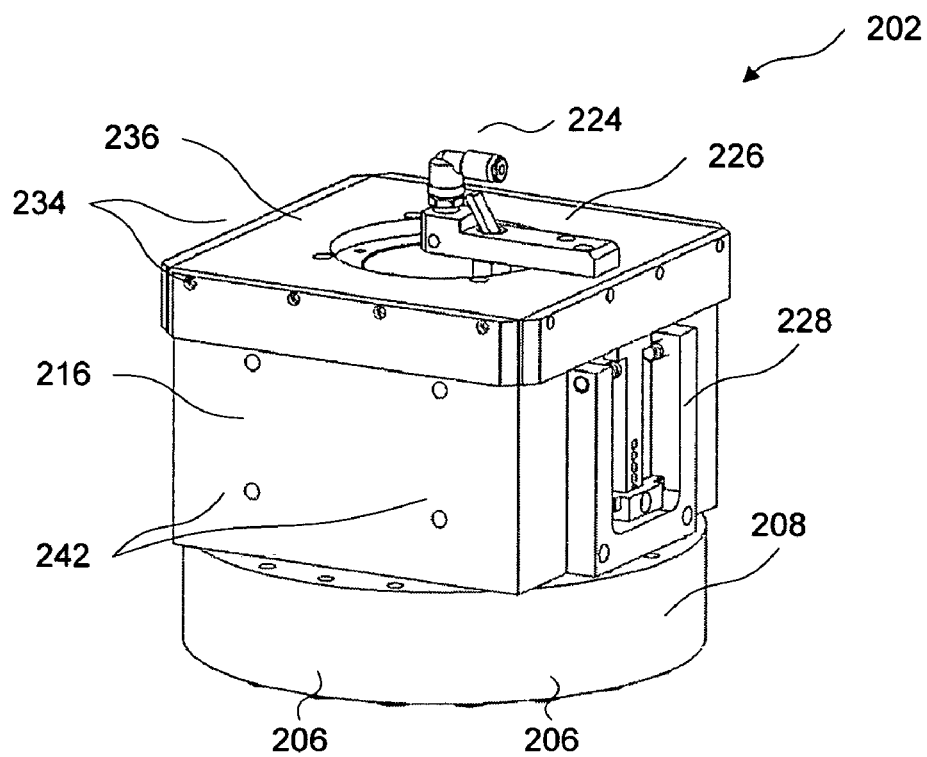
FIGS. 6 and 7 provide different perspective views of lapping fixture suitable for use in the first embodiment of the invention.
Figure 7:
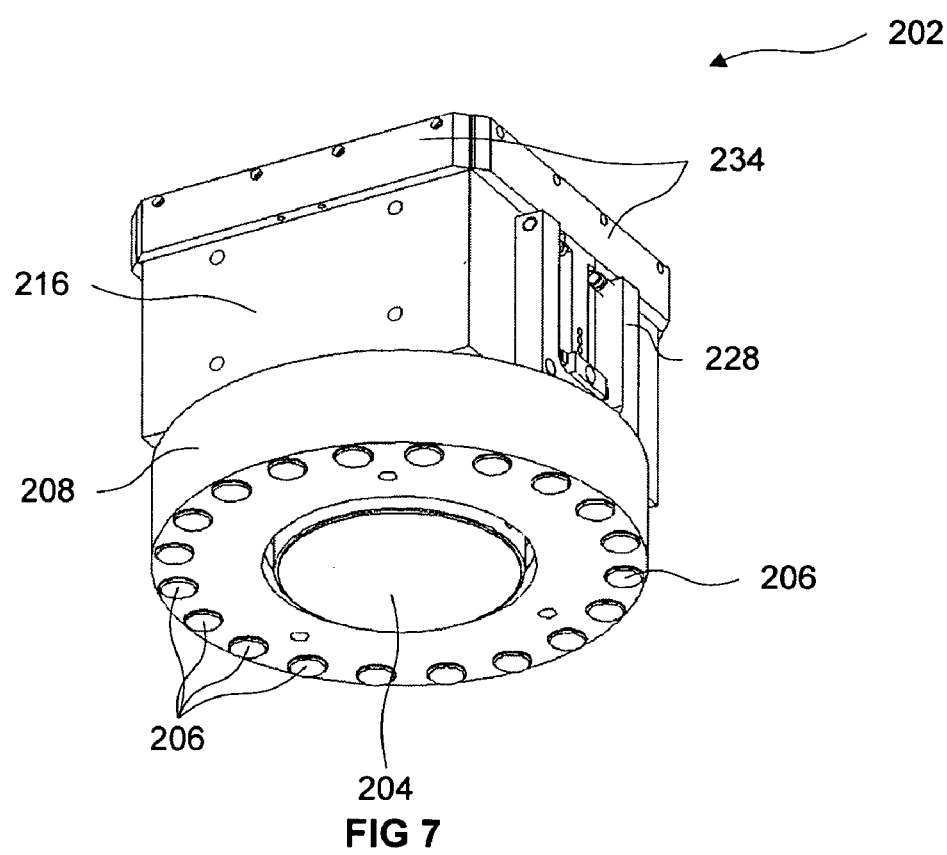
Figure 8:
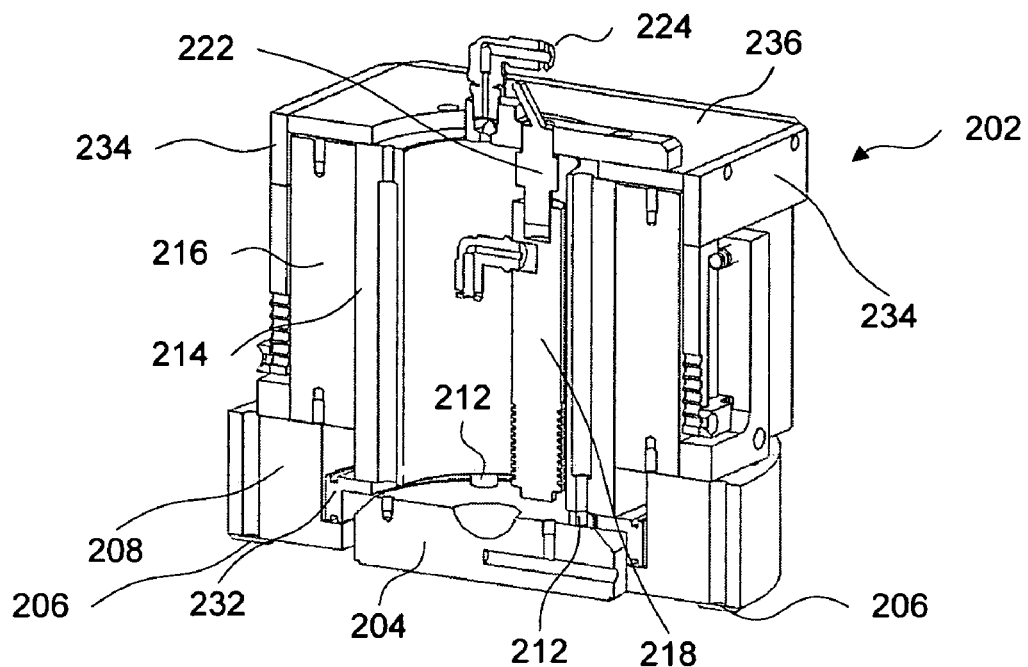
FIG. 8 provides a sectional view of the lapping fixture of FIG. 6 from a cut plane that extends vertically through the center of the fixture.

Parallelism of a layer relative to a substrate or of successive layers one to another may be maintained with the aid of a lapping fixture 202 as shown in FIGS. 6-8. The fixture includes a porous graphite vacuum chuck 204 (FIGS. 7 and 8) which is used to clamp the substrate (on which the structure is to be formed) in place which minimizes distortion of the substrate by minimizing non-uniformities distribution of vacuum on the backside of the substrate. Prior to using the Lapping Fixture for fabrication of the structure, the vacuum chuck may be lapped flat while attached to the lapping fixture to achieve co-planarity between the plane of the wear pads 206 which sit on a lapping plate during planarization operations and which are mounted on wear ring 208. This preparation of the lapping fixture additionally removes any distortion in the surface of the vacuum chuck 204 which may have been caused by the fasteners 212 which hold the vacuum chuck to a slide rail 214. Slide rail 214 is capable of moving up and down relative to slide housing 216 which is mounted on wear ring 208. The up and down movement of slide rail 214, and thus of vacuum chuck 204 result from the balancing of an upward directed spring force (e.g. from an adjustable tension style spring) and the downward directed force of gravity acting on the rail, chuck and substrate. The tension spring style counterbalance 228 allows the operator to set the effective contact pressure between the surface being planarized and the lapping plate. A venturi style vacuum generator 218 provides the vacuum required to hold the substrate to the chuck 204. A vacuum valve 222 allows the operator to turn the vacuum on and off in order to mount and remove the substrate.

The Slide Rail 214 and Slide Housing 216 include an air bearing style mechanism which assures frictionless motion with a very stiff and straight path of travel. During operation, the two components are separated by a film of compressed air that is supplied through a rotary union 224 which is held by a bracket 226 and which allows the Lapping Fixture to rotate without interrupting the flow of air. In some embodiments, the slide rail may be a square tube with a round hole through its center. The outer square dimension of the slide rail may be very accurately matched to an inner square hole through the slide housing. The housing or the slide rail may include porous graphite pads, or the like on its walls which may be useful in allowing smooth motion of the slide relative to the housing and particularly when a film of air is supplied to through these porous pads.

The Wear Ring 208 provides a stiff and stable cylindrical surface on which wear pads may be mounted and which may interface with stops, and the like, on a lapping machine for the purpose of having the Lapping Fixture rotate about a fixed axis. Wear pads (e.g. polycrystalline diamond) are affixed to the underside of the Wear Ring and define a stable plane on which the lapping fixture rotates. The wear pads wear very slowly compared to the materials on the substrate that are to be planarized and ensure that the plane defined by the Lapping Fixture remains stable throughout the course of fabricating a structure.

A slurry seal 232 (e.g. an o-ring that is pushed against the surface of the wear ring during cleaning—e.g. when the fixture is up-side down in preparation for making a measurement) is also provided that ensures that slurry does not contaminate the air bearing during normal operation and also protects the bearing during substrate cleaning operations. The Slurry Shields 234 and slide top 236 serve a similar function for the top side of the fixture.

The lapping fixture may accommodate a displacement sensor to measure relative movement between the slide housing 216 and slide rail 214. During a lapping operation, monitoring this displacement may provide a means for real time measurement of material removal from the Build. The signal from the displacement sensor may be transmitted by means of a wireless Radio Frequency or Infrared device mounted to the Lapping Fixture. Alternatively, an electrical slip ring can be used for the same purpose. In some embodiments it may be possible to associated a calibrated or absolute position with the measurement form the displacement sensor, such that in some embodiments, the displacement sensor can provide absolute end-point detection or at estimates of the state of the trimming process A plurality of holes 242 may also be provided for mounting handles that an operator may use to maneuver the lapping fixture during operation.

During preparation of the fixture for use, the vacuum chuck may be lapped using, e.g. a two micron diamond lapping slurry, after which, the vacuum chuck may be positively pressurized and isopropyl alcohol, or the like, may be used to flush the porous material clean of debris.

This lapping fixture may be used to achieve a very high degree of flatness for planarized surfaces (e.g. <0.5 microns across a 100 mm surface) while maintaining a high degree of parallelism between all layers of the build (e.g. within 0.5 microns across a 100 mm surface). The design of the fixture allows the partially formed structure to be removed from the fixture and other process operations to be performed and then the substrate remounted and planarized while maintaining a high degree of flatness and parallelism.

The use of a porous vacuum chuck described above may offer some distinct advantages in minimizing distortion of the substrate. In some embodiments, the vacuum chuck has an uninterrupted surface that is slightly smaller than the diameter of the substrate. The graphite chuck preferred in some embodiments can be easily lapped to a flatness better than 0.3 microns over a 98 mm surface while achieving a specularity sufficient to measure the flatness using a laser interferometer. The use of a porous material distributes the vacuum evenly across the surface and allows contaminants to be pulled into porous material to avoid being a source of distortion. Other styles of vacuum chucks like annular grooves may be used in some embodiments. In some embodiments, the porous graphite material may be encased in a housing (e.g. an aluminum housing) that supports and seals the porous material. The porous material may be made to sit slightly proud of the housing material to allow the surface to be lapped and mounting to the substrate to occur without interference resulting form the presence of the housing and without significant surface area from which to leak vacuum.

Various alternative planarization fixtures are possible. For example, some alternative fixtures may use adjustable mounts for mounting the vacuum chuck to the slide housing. These adjustable mounts may have calibrated adjustment mechanisms that allow adjustments to be made to the plane of the chuck relative to that of the wear pads. These adjustable mounts may be used in setting the plane of the vacuum chuck such that the outward facing surface of a substrate may be made parallel to the plane of the wear pads. Such adjustments may be made after an initial deposit of material is located on the substrate, the deposit is lapped to be parallel to the surface of the wear pads, a measurement of the plane of the substrate relative to the plane of the planarized deposits is made. One or more additional planarization operations and potentially one or more additional deposition operations may be used to confirm or adjust the parallelness of the substrate surface relative to plane of the wear pads.

In some embodiments, the front and back surfaces of the substrates are lapped to be parallel to one another within about 2 microns before starting a build. In these embodiments, the primary substrate surface (i.e. the front surface) can be as much as 2 microns out of parallel with the plane defined by the standoffs. This error may be absorbed in the first layer of the part, which may be made intentionally thicker (if necessary) and the parallelness between subsequent layers and the substrate surface may be based on a taking into account the initial error in parallelism. In other embodiments, parallelness may be compared between the plane of the first layer and that of subsequent layers. In some such embodiments, the substrates may be marked with a flat or notch that may be aligned to a marker on the lapping fixture and on an end point measurement fixture so that angular registration may remain reasonably fixed.

In some alternative embodiments, instead of lapping the chuck to be parallel to the plane of the wear pads, a mounted substrate may be lapped to have a surface that is parallel to that of that of the wear pads. In these embodiments, it may be desirable or even required that the substrate be mounted onto the vacuum chuck with the same orientation each time planarization or measurement operations are to occur.

In some embodiments it may be desirable to planarize both the vacuum chuck and then the substrate so that each is parallel to the plane of the wear pads, in which case it may not be necessary to mount the substrate and vacuum chuck with the same orientation with each lapping operation or set of lapping operations performed.

Figure 9:
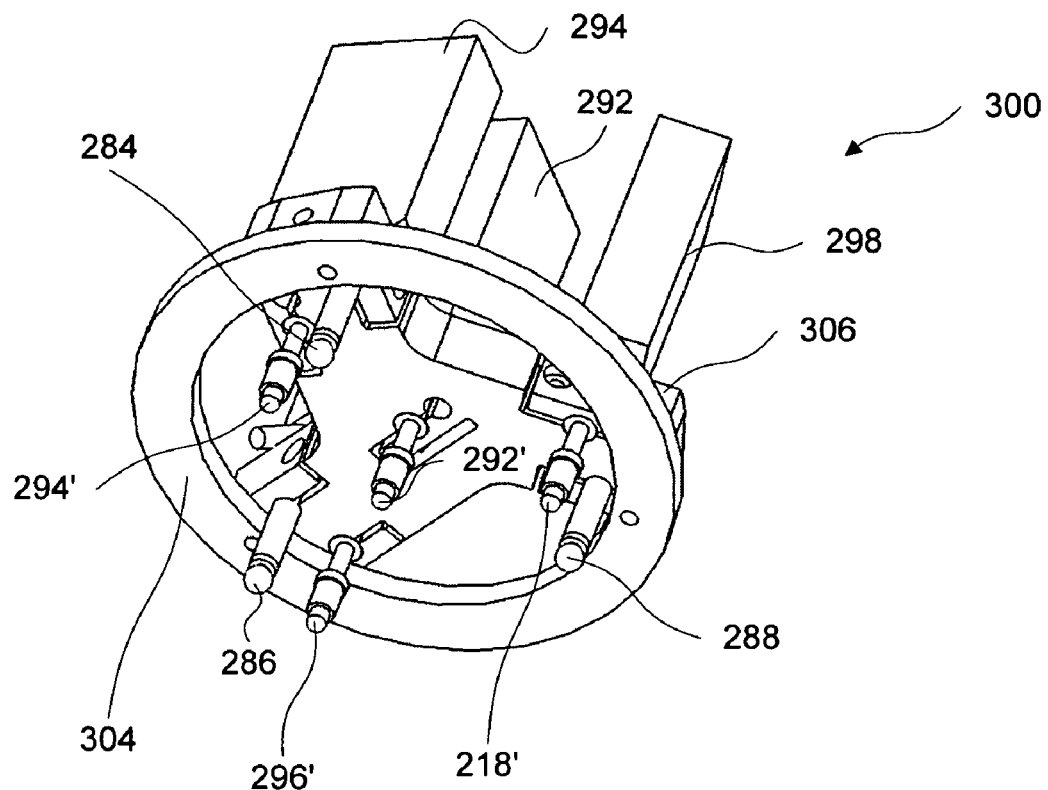
FIGS. 9 and 10 provide different perspective views of an end-pointing fixture suitable for use in the first embodiment of the invention.
Figure 10:
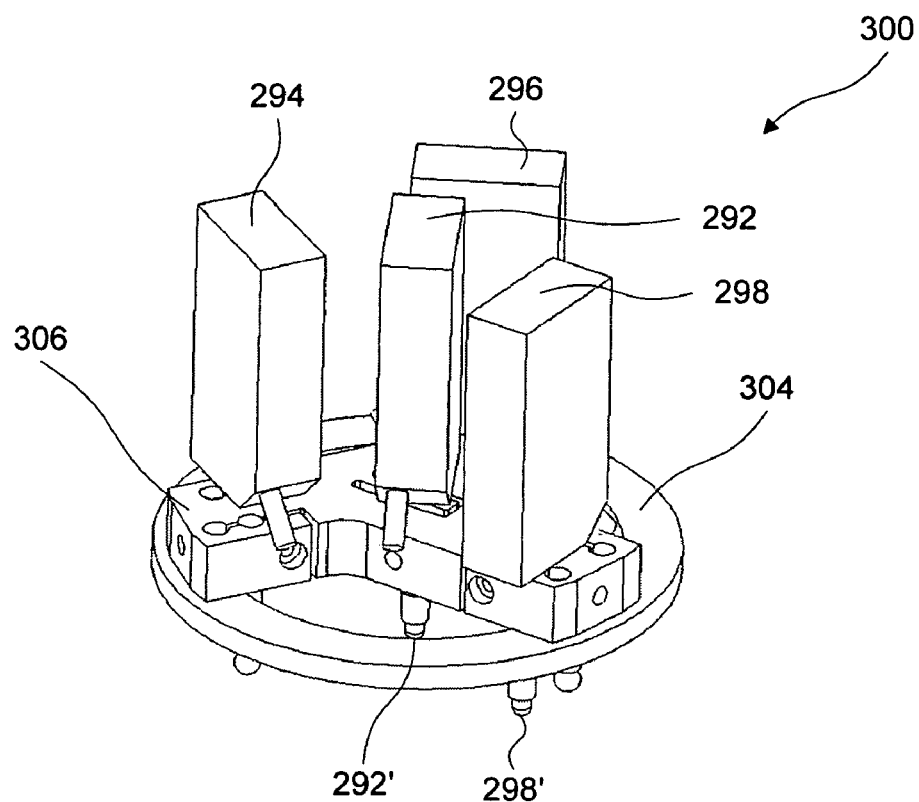
Figure 11:
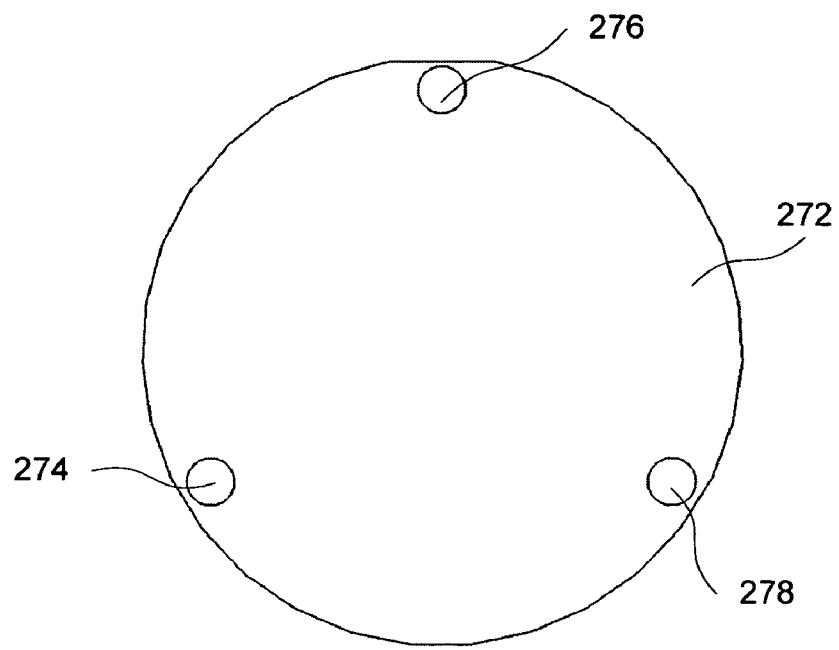
FIG. 11 schematically depicts the top view of a substrate having three end-point measuring pads.

FIGS. 9-12 illustrate perspective views of an example end-pointing apparatus of some embodiments of the invention. The end-pointing apparatus or fixture may be used during periodic breaks in the planarization operations to measure planed heights of deposits relative to the primary surface of the substrate on which the structure is fabricated. FIG. 11 schematically depicts a substrate 272 having three (3) pads 274, 276, and 278 on its surface that will be maintained free of deposits throughout the fabrication process. These pads will be used as the required references from which deposition height measurements can be based.

In some embodiments (e.g. for example as exemplified in FIGS. 9-12, three end-point detection pads may be used and are preferably maintained in an un-deposited state throughout a build process and either remain exposed throughout the process or can be made to be exposed when necessary to make measurements. In some embodiments, the pads may be located near the edge of the wafer and are 120° apart relative to a coordinated axis located at the center of the substrate.

Various methods may be used to prevent deposition on the end-point detection pads, for example when using a dielectric substrate with an applied adhesion layer and seed layer the pads can be covered with resist, wax, lacquer, adhesive tape, etc. prior to coating with metal layers and then the covering may be removed to expose pads in order to make measurements. If one or more metal layers have already been deposited in the pad area, they can be removed by selective etching. In some embodiments pad areas may be surrounded by structural material 'grommets' having an inside diameter that defines the pad diameter; selective etching (e.g., using an etchant-soaked swab) may then be performed within the grommets to expose the pads as required. If the substrate is a platable metal, the pads may be coated with resist, wax, lacquer, adhesive tape, deposited dielectric (e.g., parylene, silicon dioxide, silicon nitride), etc. prior to deposition and prior to making measurements the coating material may be removed. On the other hand, if the coating material is a dielectric and if it is thin enough (to avoid being planarized and hard enough, it may be left in place throughout the entire build. Alternatively, such dielectric coating may be added prior to plating and removed prior to measurement. In still other embodiments, a dielectric (e.g., alumina) insert may be provided in the wafer in the vicinity of the pads. This may have the form of a disk that is inlaid within the wafer and glued in place (a press fit may also be possible, though it must be stable during thermal cycling of the wafer). The inserts can be co-planarized with the wafer, or if not flush with it, their positions can be measured with respect to the general wafer surface and recorded and used to determine the height and parallelism of layers that are later deposited.

FIG. 9 presents a perspective view of an end-pointing apparatus 300 which includes three fixed standoffs 284, 286, and 288 that interface with the end point measuring pads 274, 276, and 278 on substrate. In some embodiments, the standoff to pad correlations may need to be fixed (e.g. standoff 284 must always mount on pad 274, standoff 286 must always mount on pad 286, etc.) depending on how the data from the end point measurement fixture is going to be used and whether or not the front surface of the substrate is parallel to the plane of the wear pads. The tips of the standoffs are preferably made of a hard material that will not deform significantly during the measuring process so as to avoid introduction of a source of potential measurement error.

Figure 12:
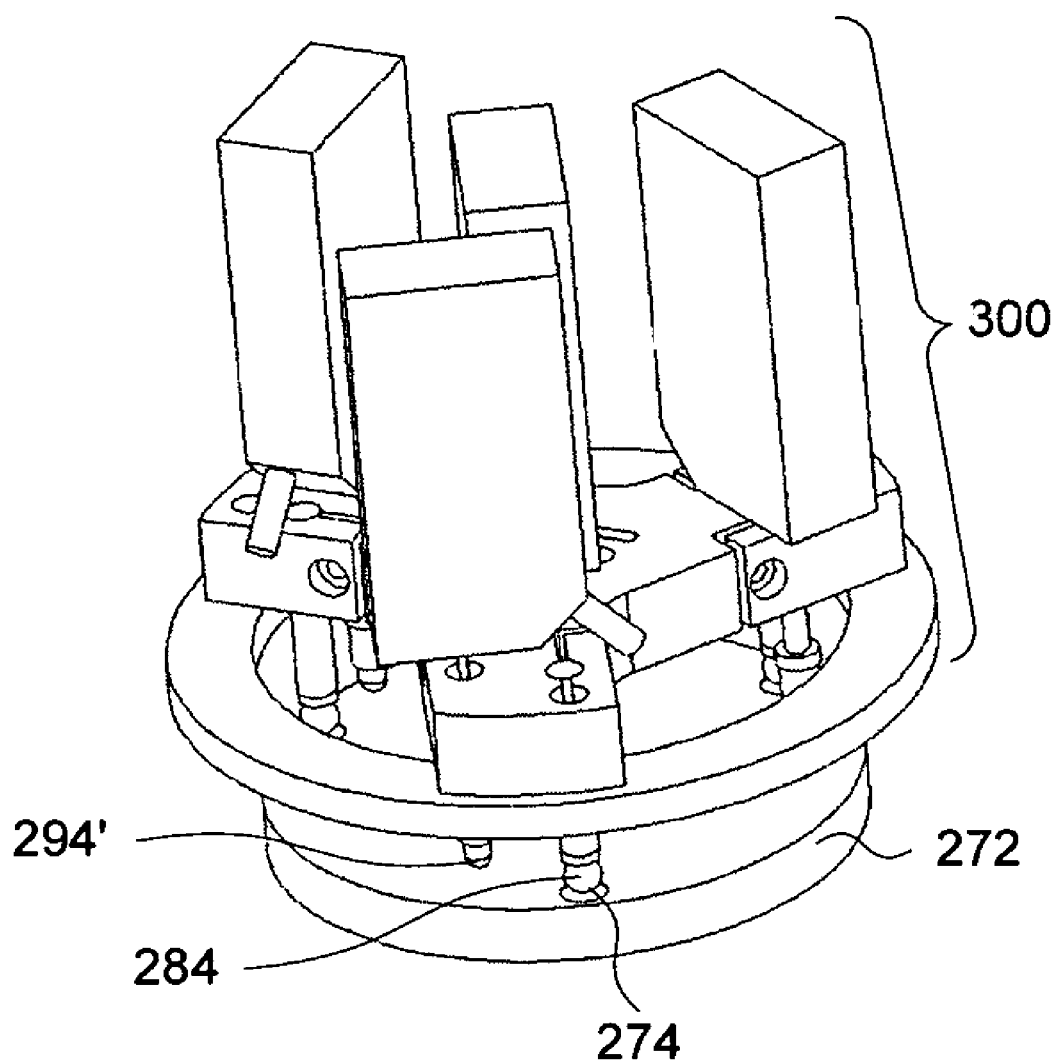
FIG. 12 provides a perspective view of the end-pointing apparatus of FIGS. 9 and 12 mounted on the substrate of FIG. 11.

The end-pointing apparatus 300 also includes a handling ring 304 and a fixture clamping plate to which the fixed standoffs are attached. Also attached to the fixture clamping plate is one or more measurement probes (as depicted in FIGS. 9, 10, and 12—four probes 292-298, including tips 292'-298' are depicted) which have retractable measuring probe tips that may be controllably and measurably extended to contact a planarized deposit on the surface of the substrate. In some embodiments, the probe tips are extended via air pressure and a precision air pressure regulator is used to ensure that repeatable and equal pressure is applied to all four probes. The weight of the fixture is preferably (but not necessarily) significantly higher than the combined force applied by the four probes so that accuracy is not affected. A valve is used to extend and retract the probe tips. The tips are normally retracted and extended outward to take a zero reading or to take a measurement. In some embodiments, a Heidenhain Metro MT1287 length gage may be used while in other embodiments an LVDT type sensor may be used with the possible benefit of increasing measurement accuracy. In some embodiments, probe retraction occurs by using a spring in combination with decreased extension pressure. In other embodiments, it may be possible to use probes that provide a non-contact measurement of deposition height. In still other embodiments, the fixed length probes (i.e. standoffs) may contact the deposited material and the adjustable length probes or non-contact probes may contact or make a measurement using the end-pointing pads.

The fixture clamping plate 306 has an appropriate stiffness and clamping force that assures accurate measurement. The handling ring, in some embodiments is made from a material that conducts very little heat to ensure that heat from the operator's hands does not cause dimensional distortion in the measuring fixture. In other embodiments, the fixture may have fewer or more standoffs and/or fewer or more probes.

The difference in the measured displacement values when the probes contact a flat plate on which the standoffs sit during a calibration process and when they contact a surface to be measured give rise to a planarized material thickness and potentially to ability to ascertain a plane of the surface relative to a surface of a previously detected plane or the surface of the substrate, and potentially give rise to an ability to ascertain overall planarity of the surface itself.

FIG. 12 provides a perspective view of the end-point measuring apparatus or fixture 300 sitting on a substrate to be measured where the three standoffs have been located on the measuring pads.

In some embodiments, each measuring probe 292-298, having movable tips 292'-298', respectively, may be an encoder based measuring device with an accuracy that allows suitable tolerance criteria to be met (e.g. they may operate with 0.01 micron resolution and +/− 0.05 micron repeatability and +/− 0.2 micron accuracy over a 12 mm travel). The movable probe tips may be normally retracted but can be extended by air pressure with a settable contact force or at least a force that is appropriate for measuring the desirable materials, based on the contact areas of the probes, and potentially on the weight of the fixture itself.

The four probe devices 292-298 of a preferred device are more clearly visible in FIG. 10 while the four associated probe tips 292'-298' are more clearly visible in FIG. 9. In some embodiments, prior to performing a measurement, all four (4) probes are zeroed in an extended position while the fixture sits on a reference flat (e.g. an optical flat). In other embodiments, probe position values may simply be recorded at the extended flat plate positions and the differences between such values and values taken when measuring planned depositions used in determined deposition height and possibly parallelness and planarity.

In some embodiments, measurements from the four probes taken from planed deposition are used to compute the plane of the surface using a least squares fit. The X and Y slopes (slopes of the planes along the X and Y axes which are assumed to be two perpendicular axes in the plane of the surface of the substrate) and the z-intercept are calculated. The z-intercept may be used as an indication of the thickness of the planed deposit (e.g. total thickness of all deposits) relative to the primary substrate surface. The X and Y slope values may be used to determine if the measured plane has strayed too far from parallelness with the primary substrate surface or with a hypothetical surface. A large value in X or Y slope may indicate that there is a problem with the planarization equipment or that contamination (e.g. uneven pad wear, dirt, slurry particles or the like interfered with the proper mounting on the vacuum chuck or the like). In actuality, if the front surface of the substrate is not made planar to the back surface of the substrate, a significant difference in plane orientation between the deposited material and that of the front surface of the substrate may exist and in such case it may be beneficial to compare the orientation the plane to that of the first deposited layer of material or that associated with some other layer of deposited material or that associated with a hypothetical plane. Alternatively, the substrate may be initially coated with a layer of planarized material which will be made to have measuring pad regions defined thereon and to which subsequent deposit thicknesses and plane orientations may be measured.

In some embodiments, plane slope is used to determine if parallelism control is working adequately. A tight acceptance tolerance may be used (e.g. 0.01 microns per millimeter, which corresponds to a 1 micron wedge across a 100 mm surface).

In some embodiments, as noted above, fixed length elements may contact the deposited material, while movable probes may be made to contact the contact pads on the substrate or on materials associated with a previously formed layer.

In some embodiments, instead of using the probes of the endpoint measurement apparatus to determine planarity, a laser interferometer may be used to check that the appropriate flatness has been achieved (e.g. 0.3 microns). If the flatness is out of specification it may be an indication that the lapping plate needs to be replanarized.

In some embodiments, measurements are made based on a timed amount of lapping which is estimated by the operator to be less than that necessary to reach the desired goal. The final layer thickness value is reached through iterative steps of planing and measurement that converge on the right value.

In some embodiments, as shown in the example of FIGS. 5B and 5C, multiple planarization operations may be used in achieving a desired layer thickness or partially formed structure thickness. A rough lapping step may involve use of a course abrasive (e.g. 9 micron abrasive particles) which may bring the lapped level, for example, to a value equal to the thickness of all previous layers plus the thickness of the current layer plus a 4 micron offset within a tolerance of +/−0.1 microns. A fine abrasive may then be used (e.g. a 2 micron abrasive) to bring the thickness, for example, to a value of 0.1+/−0.05 microns above the desired position of the final surface. All these measurements may be performed while the substrate remains clamped to the fixture. In some embodiments a final polishing step may be used where it is assumed that some amount of material will be removed (e.g. 0.1 microns). This operation may be performed without use of a lapping a fixture. In some embodiments, once the substrate is removed from the fixture, it is not desirable to perform measurements due increased risk of substrate flexing and the like. In these embodiments final measurements after polishing may or may not be performed.

In some embodiments, a single planarization process may be performed and repeated as necessary until a desired surface level is reached.

In some embodiments, thick substrates, e.g. wafers having thicknesses in the range of 10 mm for a 100-mm diameter, 15 mm for a 150-mm diameter wafer, and the like may be used, Such thick substrate may offer the following advantages: (1) they remain flat even when metal films with high stress are deposited on them, (2) they are less influenced by the flatness of vacuum chucks or other fixtures during planarization, (3) they are easier to planarize to a high level of flatness and parallelness of the opposing faces, and/or (4) they are more robust for handling during processing. Such wafers may be thinned after layer fabrication is complete (e.g., using a ID/annular saw, a diamond wire saw, etc.). In other embodiments, thick substrates may be obtained by bonding a thick 'carrier' to a thinner substrate so as to provide the effect of a thicker wafer.

Various enhancements and alternatives to the method embodiment of FIG. 5A and to the lapping fixture apparatus of FIGS. 6-8 and the end-point detection apparatus of FIGS. 9-12 as discussed above are possible. For example, in some alternative embodiments, the displacement value ascertained from a measurement device in the lapping fixture may be used to provide end-point detection for some or all layers. In some embodiments, the substrate may remain mounted to the lapping fixture during measurement, while in other embodiments, measurement may occur after the substrate and fixture are separated. In some embodiments, a nonporous vacuum chuck may be used (e.g. a vacuum chuck with machined openings or the like) while in other embodiments a porous vacuum chuck from a material other than graphite may be used. In some embodiments, the source of vacuum that holds the substrate to the vacuum chuck may be a venturi-style generator that feeds off the same air supply that provides the bearing forces between the slide rail and housing as discussed above, while in other embodiments other types of vacuum generators may be used and or other sources of air pressure may be used.

Various other embodiments of the present invention exist. Some of these embodiments may be based on a combination of the teachings herein with various teachings incorporated herein by reference. Some embodiments may not use any blanket deposition process and/or they may not use a planarization process. Some embodiments may involve the selective deposition of a plurality of different materials on a single layer or on different layers. Some embodiments may use selective deposition processes or blanket deposition processes on some layers that are not electrodeposition processes. Some embodiments may use nickel as a structural material while other embodiments may use different materials. Some embodiments may use copper as the structural material with or without a sacrificial material. Some embodiments may remove a sacrificial material while other embodiments may not. In some embodiments an anode (used during electrodeposition) may be different from a conformable contact mask support and the support may be a porous structure or other perforated structure. Some embodiments may employ mask based selective etching operations in conjunction with blanket deposition operations. Some embodiments may form structures on a layer-by-layer base but deviate from a strict planar layer by planar layer build up process in favor of a process that interlaces material between the layers. Such alternating build processes are disclosed in U.S. application Ser. No. 10/434,519, filed on May 7, 2003, entitled "Methods of and Apparatus for Electrochemically Fabricating Structures Via Interlaced Layers or Via Selective Etching and Filling of Voids" which is hereby incorporated herein by reference as if set forth in full.

Though the various embodiments set forth above have focused on lapping as the preferred planarization technique, the techniques disclosed herein may also have application when the planarization technique is something other than lapping, e.g. chemical mechanical planarization, milling, diamond fly cutting or the like. In particular, it is believed that the end pointing fixture and method will be applicable when the planarization process is something other than lapping. Teachings concerning the use of diamond fly cutting for planarization operations during electrochemical fabrication processes may be found in U.S. patent application Ser. No. 11/029,165 filed concurrently herewith by Cohen, et al. and which is entitled "Electrochemical Fabrication Methods for Producing Multilayer Structures Including the use of Diamond Machining in the Planarization of Deposits of Material". This application is hereby incorporated herein by reference as if set forth in full herein.

Figure 13:
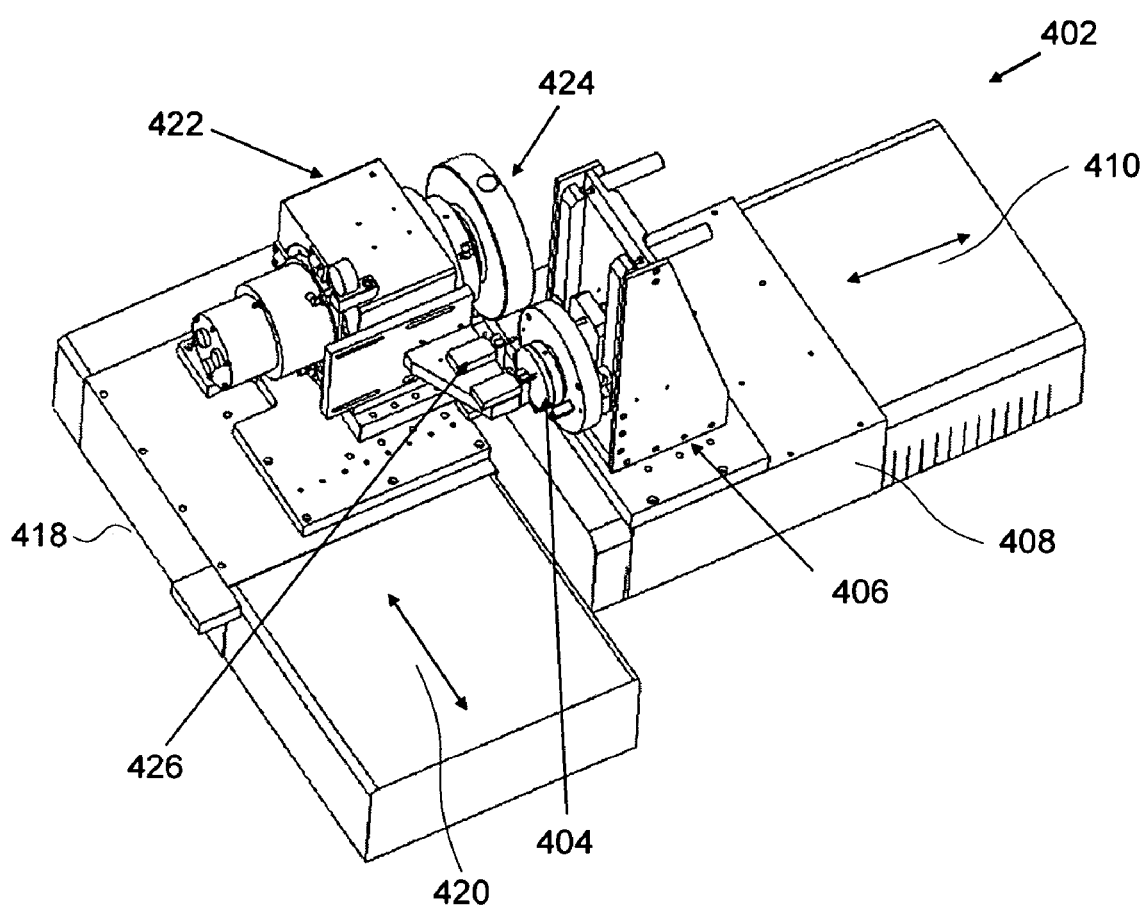
FIG. 13 provides a perspective view of a fly cutting machine layout according to some embodiments of the invention.

Further embodiments of the invention relate to methods and apparatus used for building multi-layer or single layer structures or devices where planarization is performed with a single point diamond machining process on a fly cutting machine (e.g. the fly cutting machine of FIG. 13). The apparatus and methods discussed below allow an operator to measure and adjust a primary plane of the substrate such that the new plane established during fly cutting is parallel to the primary plane of the substrate.

The same apparatus also allows the operator to measure an approximate incoming thickness of a deposited layer or layers. The operator could then perform an initial fly cutting step to establish a flat surface parallel to the primary substrate surface of the substrate. In some embodiments, by measuring the thickness of this parallelized surface, the operator can ascertain how much more material needs to be removed to achieve the desired layer thickness and can command the machine to deterministically remove precisely that amount of material. In some embodiments, one or more checks may be made to ensure that the newly defined plane is parallel to the primary substrate surface. Depending on the differential height of the initial deposit and the desired height of the planarized layer, fly cutting may remove all needed material in a single pass of the blade across each portion of the surface or multiple passes may be made with or without intermediate measurement operations. Periodically, the plane of cutting may be checked and any necessary orientation modifications to the substrate made to ensure that successive layers remain parallel to one another and have appropriate thicknesses. Once the final fly cutting step is performed, layer thickness may be confirmed as well as the plane of the new surface.

As with the lapping based planarization embodiments discussed above, measurements and planarization operations are preferably based on a primary surface of the substrate (e.g. a front surface of the substrate on to which layers of material are added) as determined from three measurement pads (e.g. detection pads, contact pads, and the like) located on the substrate as shown in FIG. 11. In preferred embodiments, these pads are maintained throughout the fabrication process for each build. It should be understood by those of skill in the art that in some alternative embodiments, instead of using pads located on the front surface of a substrate pads may be located on a rear surface of the substrate. In still other alternative embodiments, instead of maintain fixed pads on the surface of the substrate, pads formed on each or on a portion of the successive layers may be used in ascertaining planarity and setting heights of one or more subsequent layers that are formed.

FIG. 13 provides a schematic perspective view of the major components of a fly cutting machine. The substrate 404 on which electrochemically fabricated structures are built up is attached to a substrate plane adjustment 406 which in turn is mounted to a z-axis stage 408 that is capable of moving in the z-direction defined by arrow 410. The z-axis is the axis that extends in a direction that is substantially perpendicular to the plane swept by the fly cutting tool. The z-axis stage 408 and an x-axis stage 418 are mounted to a vibration isolated mass (not shown) that provides a mechanically stable platform for the apparatus as a whole. The x-axis extends in a direction perpendicular to the z-axis and allows back and forth movement in the direction indicated by arrow 420. The x-axis stage holds the fly cutting spindle 422 which in turn holds the Fly Cutting Tool Holder 424 which in turn holds the fly cutting tool itself (not shown). In some embodiments, the tool mounted to the tool holder is a single crystal diamond while in other embodiments other tool materials may be used. A measuring fixture 426 attaches to the spindle housing.

The spindle 422 uses an extremely stiff and stable high speed air bearing. The x-axis and z-axis stages 408 and 418 are extremely accurate and stiff and use oil hydrostatic bearings. The spindle, x-stage, and z-stage portions of the apparatus (exclusive of the substrate plane adjustment fixture, substrate holder, and measuring fixture) along with computer control hardware, software, vibration isolated mass, protective housing and the like may, for example, be purchased from Moore Nanotechnology Systems, LLC of Keene, N.H. as model number Nanotech 350UPL. These components combine to provide a machining system with a 10 nanometer positioning resolution and the ability to fly cut a surface with flatness on the order of 100 nanometers across a 100 mm diameter.

The substrate can be positioned by the z-axis stage while the measuring fixture can be positioned by the x-axis stage so as to allow them to be brought together so that height, plane orientations and the like can be measured. Using the x-axis stage and the z-axis stage, the substrate and path of the fly cutting tool may be made to intersect. Free wheeling of the fly cutting tool holder relative to the spindle can allow the fly cutting tool to be rotated back and forth in the path of the substrate while incrementally moving the z-axis stage forward to allow contact between the tool and substrate to occur during set up operations and the like.

Figure 14:
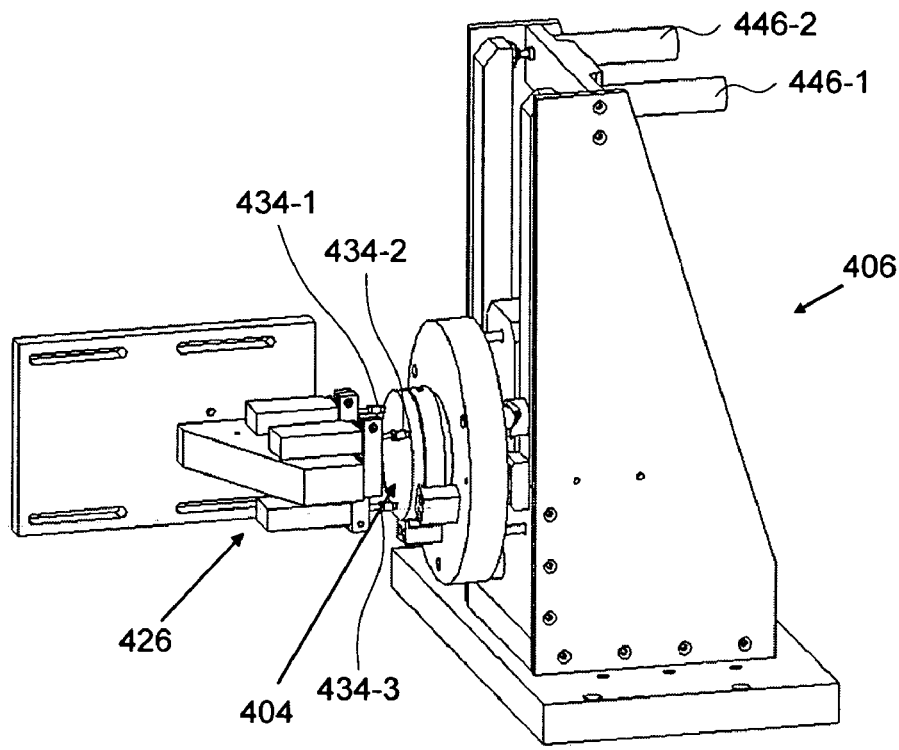
FIG. 14 provides a close up perspective view of the measurement fixture and substrate holding and plane adjustment fixtures of the machine layout of FIG. 12.

In FIG. 14, three measuring probes fingertips 434-1, 434-2, and 434-3 form the contact portions of computer controllable and readable measuring probe device 432-1, 432-2, and 432-3. The probes are drivable along the z-axis and can give electronic readouts of position when they contact a surface to be measured. When a surface of desired position and/or orientation is encountered the probe readings can be re-zeroed so as to set a reference plane. During some uses, the tips of the probe fingers are positioned along the x-axis so that they may be aligned with and contact the three measurement pads 274, 276, and 278 on the substrate when the substrate is set on and held by the holder in a predefined orientation. In other uses, the positioning of the probes may be defined so that tips contact regions on the substrate adjacent to or remote from the measurement pads. In still other uses the substrate may be place onto the holder with a non-standard orientation so that the tips do not align with the pads. Such non-standard orientation positioning may be used to yield information about the parallelness of the front and back surfaces of the substrate.

The probe tips are extendible using air pressure provided by a high precision air pressure regulator such that all the probes contact with equal and repeating contact force. In typical operation, the substrate and probes are brought into x-axis position while the probe tips are retracted. Once in position, the probe tips are extended and the three measurements are taken. The plane of the primary substrate surface is ascertained from the reading taken from the three measurement pads. If the orientation of the measured plane does not match the orientation of a desired plane, the plane of the substrate reference surface can be adjusted to any plane within the range of the allowable by the plane adjustment fixture. Typically the plane of the reference surface is adjusted to have a zero slope relative to the X-Y plane of the machine which is also the plane that the fly cutting tool generates when planarizing a surface. In practice, after adjustment of the plane using the two linear actuators 446-1 and 446-2, the probe tips could be mad to contact the reference pads again to measure and confirm that the plane of the substrate has been properly adjusted. In some cases, repeated measurement and adjustment can improve the alignment upon what can be accomplished in a single pass; however, this has typically been found to be unnecessary. After measurement the probe tips are typically retracted so that inadvertent scratching of the substrate does not occur.

Figure 15:
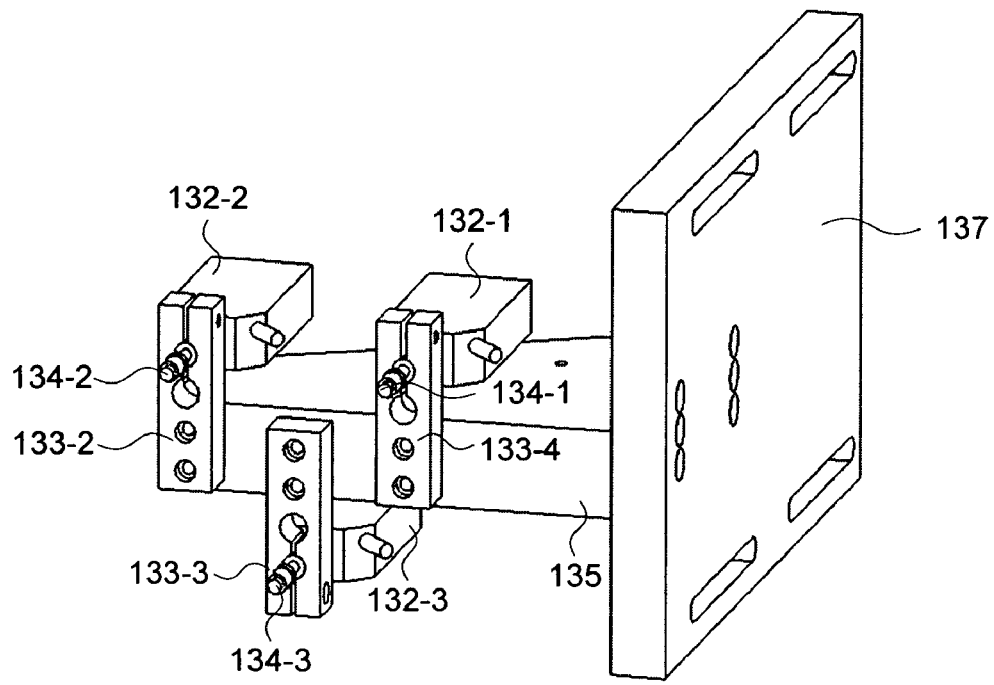
FIG. 15 provides a perspective view focusing on the measurement fixture of FIG. 14.
Figure 16:
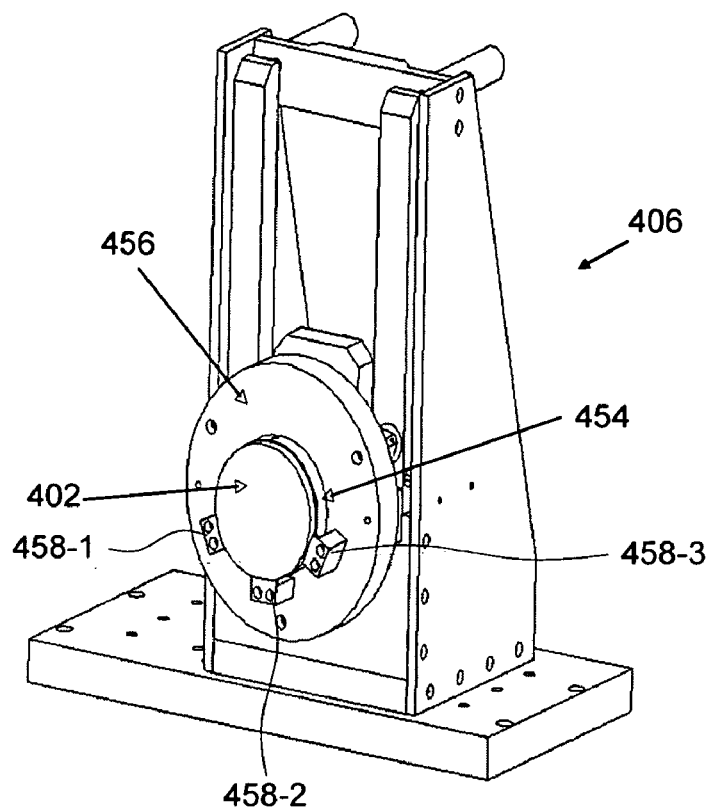
FIG. 16 provides a perspective view focusing on the substrate holding and plane adjustment fixtures of FIG. 14.

FIG. 15 shows a detailed view of the measuring fixture. The measuring probes 132-1-132-3 are held by the probe clamps 133-1-133-3 which in turn are attached to a horizontal plate 135 and which in turn is attached to a vertical plate 137 which in turn attaches to the Spindle Housing 422 as shown in FIG. 13.

FIG. 5 shows the substrate mounted to the substrate plane adjustment fixture using a porous carbon vacuum chuck 454. The porous carbon material allows the vacuum chuck 454 to be fly cut on the machine after it is mounted to the fixture such that it has the same slope as the plane of cutting (e.g. flat to within 0.3 microns across a 100 mm surface). This ability can be used to remove any distortion introduced during mounting of the vacuum chuck to the kinematic plate 456. The vacuum chuck is controllably connected to both a vacuum supply and a supply of air pressure such that the substrate may be controllably attached, released, and be easily positionable relative to the chuck.

On bottom an lower sides of the vacuum chuck three substrate locating brackets 458-1-458-2 are used to help position the substrate. The bottom bracket 458-2 provides a flat surface that allows a flat on the edge of the substrate (e.g. 18 mm flat edge) to rest on the flat bracket surface so as to help provide rotational registration prior to turning on the vacuum. The Kinematic plate provides a stable base to which the kinematic components may be attached on the back side.

Figure 17:
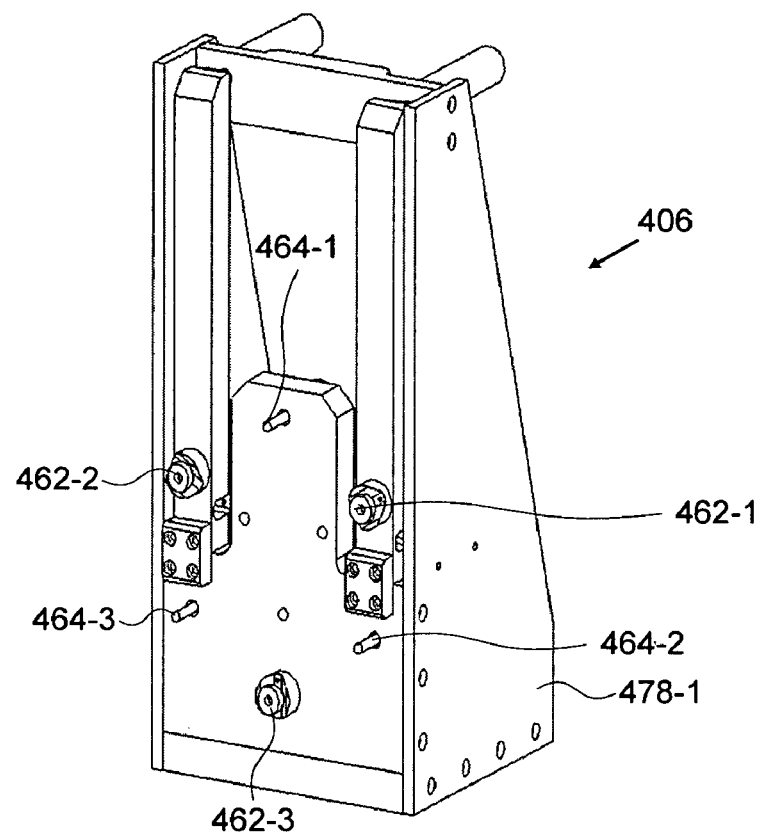
FIG. 17 provides a perspective view focusing on the plane adjustment fixture of FIG. 14 with the kinematic plate of the substrate holding fixture and the substrate itself removed.

FIG. 17 shows the substrate plane adjustment fixture 406 with the kinematic plate 456 removed. Three truncated spheres 462-1-462-3 are attached to the Kinematic Plate such that they rotatably mate with three grooved brackets. In FIG. 17 the three spheres are shown disconnected from the kinematic plate. One of the grooved brackets is located on a fixed vertical plate 466 mounted to a base 467 which is in turn mount to the Z-stage while the other two brackets are located on two flexure arms that can be move to adjust the plane of the substrate when mounted on the vacuum chuck. Three spring biased tensioning bolts 464-1-464-3 extend through the fixed vertical plate 466 and attach to and pull the Kinematic plate, and associated truncated spheres, against the grooves with a large preload force (e.g. 500 pound preload), thus creating a stiff mechanism.

Figure 18:
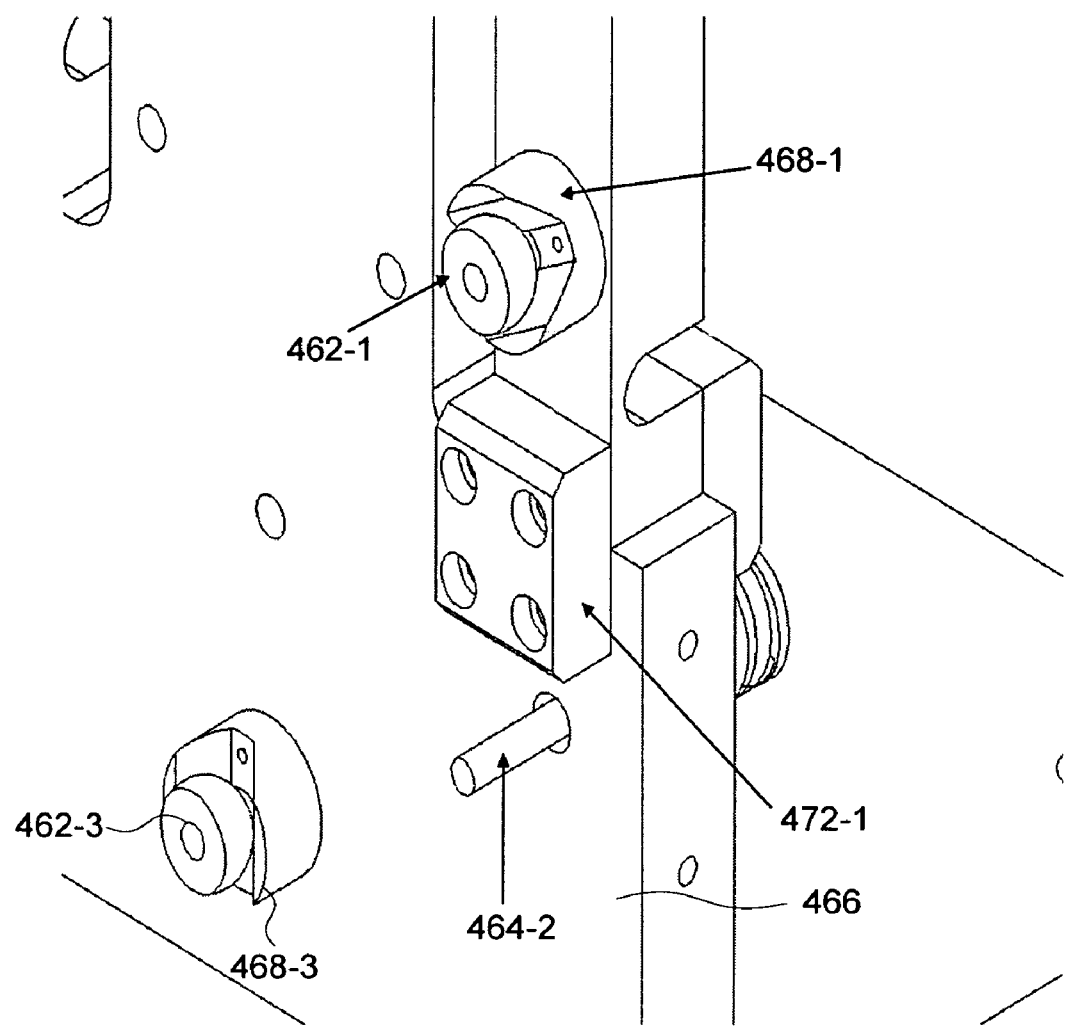
FIG. 18 provides a perspective view focusing on specific components of the plane setting fixture, including truncated sphere elements, adjustment arm flexure points, vacuum chuck attachment brackets and spring loaded rods for holding the vacuum chuck under tension.

FIG. 18 shows a magnified view of a portion of the kinematic components including truncated spheres 462-1 and 462-3, associated grooved brackets 468-1 and 468-2, tensioning screw 464-2, attachment bracket 472-1 which attaches flexure arm 474-1 to fixed vertical plate 466. The truncated spheres and grooves are constructed from hardened steel to ensure the geometry of the components remains stable.

Figure 19:
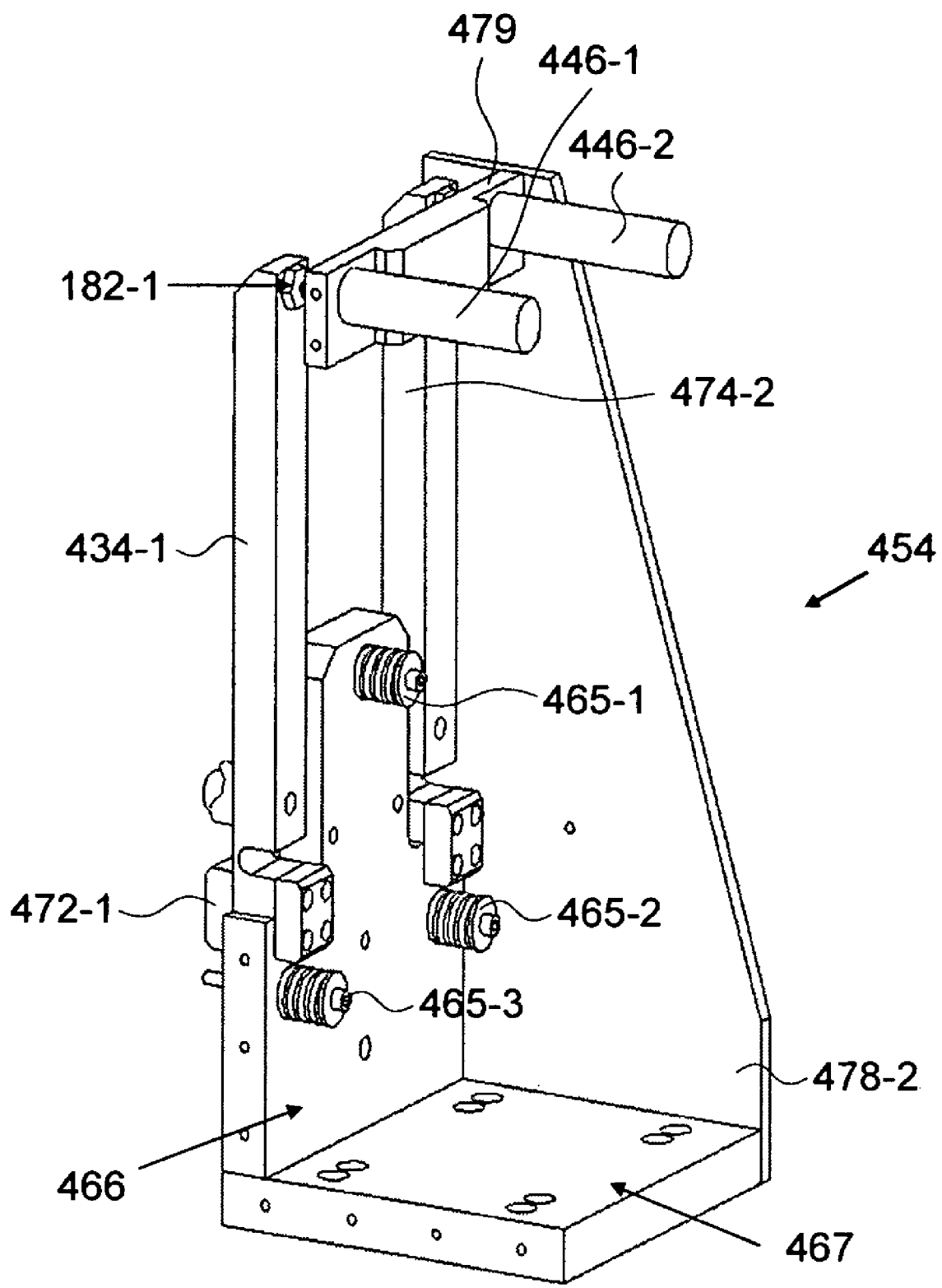
FIG. 19 provides a perspective view of the backside of the plane setting fixture of FIG. 14.

FIG. 19 shows the back side of substrate plane adjustment fixture 454 with the side plate 478-1 removed to reveal some additional components. There are three tensioning compression springs 465-1 to 465-3 that work with the tensioning bolts to create the large preload on the kinematic plate. There are two flexure lever arms 474-1 and 474-2, each having one of the grooved brackets attached. Flexure points 473-1 and 473-2 provide the rotation points for flexure lever arms 474-1 and 474-2, respectively when linear actuators 446-1 and 446-2, which are mounted to side plates 478-1 and 478-2 via cross bar 479, are driven to new positions. The attachment brackets, also shown on FIG. 18, connect the Flexure Lever Arms to the Vertical Plate shown in FIG. 19. Each linear actuator is used to actuate each flexure arm. The mechanical advantage achieved by having the actuation point offset from the kinematic contact of the groove and truncated sphere achieves two goals: (1) providing mechanical leverage, otherwise due to large preload, the linear actuators would have to be much more powerful, costly and/or less accurate; and (2) providing increased accuracy due to the mechanical advantage. In the present embodiment, the mechanism provides a 10 to 1 mechanical advantage but in other embodiments smaller or larger mechanical advantages ma be utilized. The present actuators (e.g. Diamond Motion Actuators N100DC) have a resolution of 0.1 microns, giving the system a 10 nanometer resolution for plane adjustment. Also visible in FIG. 19 is one of the tungsten carbide strikes 182-1 that is used at the contact point between the Linear Actuator and the Flexure Lever Arm.

Figure 20:
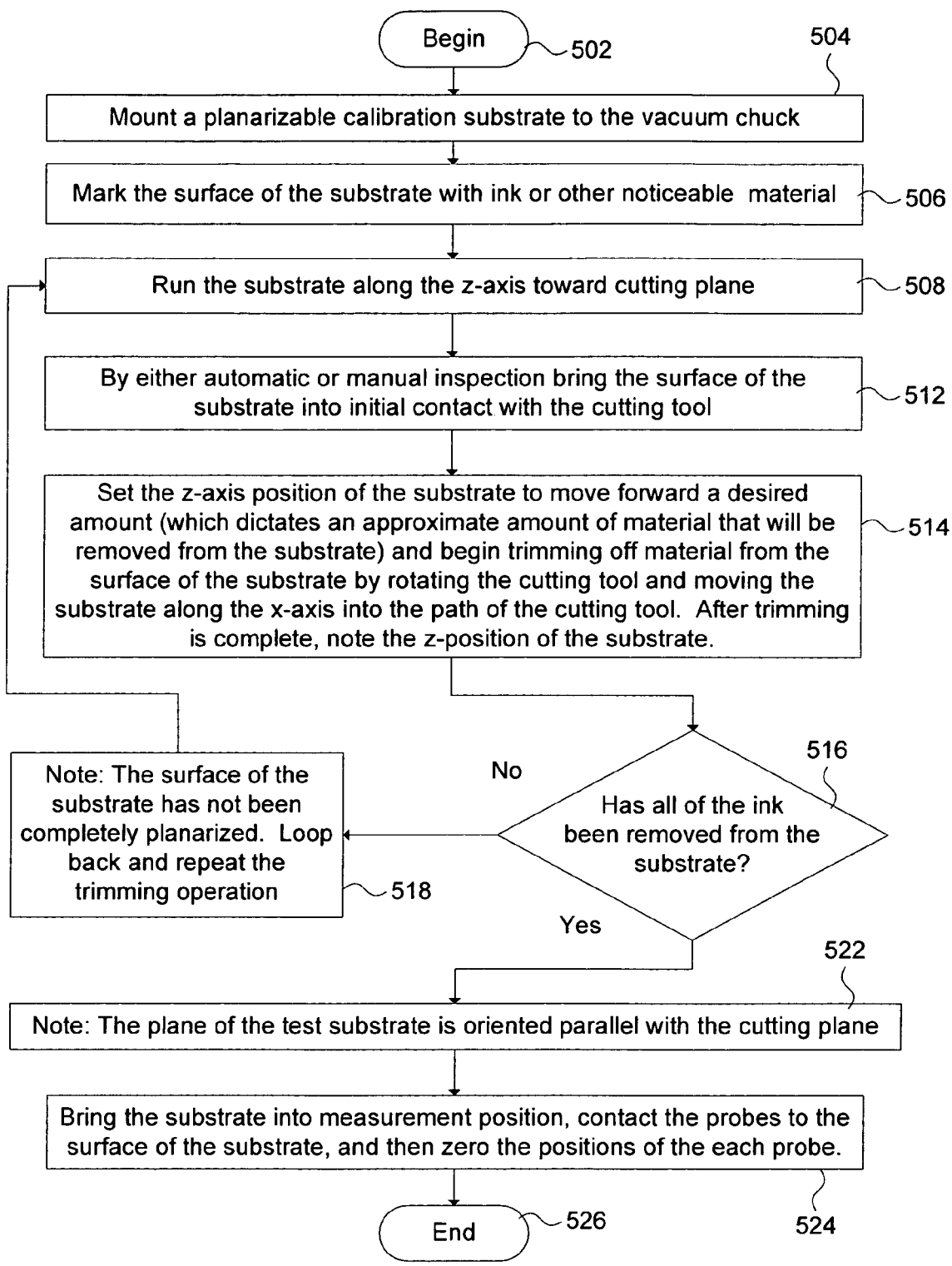
FIG. 20 provides a block diagram setting forth sample operations that may be used in matching the zero plane of the measurement fixture and probes of FIGS. 13-15 with a plane cut by the fly cutting tool.

FIG. 20 provides a flowchart setting forth sample operations that may be used in matching the zero plane of the measurement fixture and probes of FIGS. 13-15 with a plane cut by the fly cutting tool.

Figure 21:
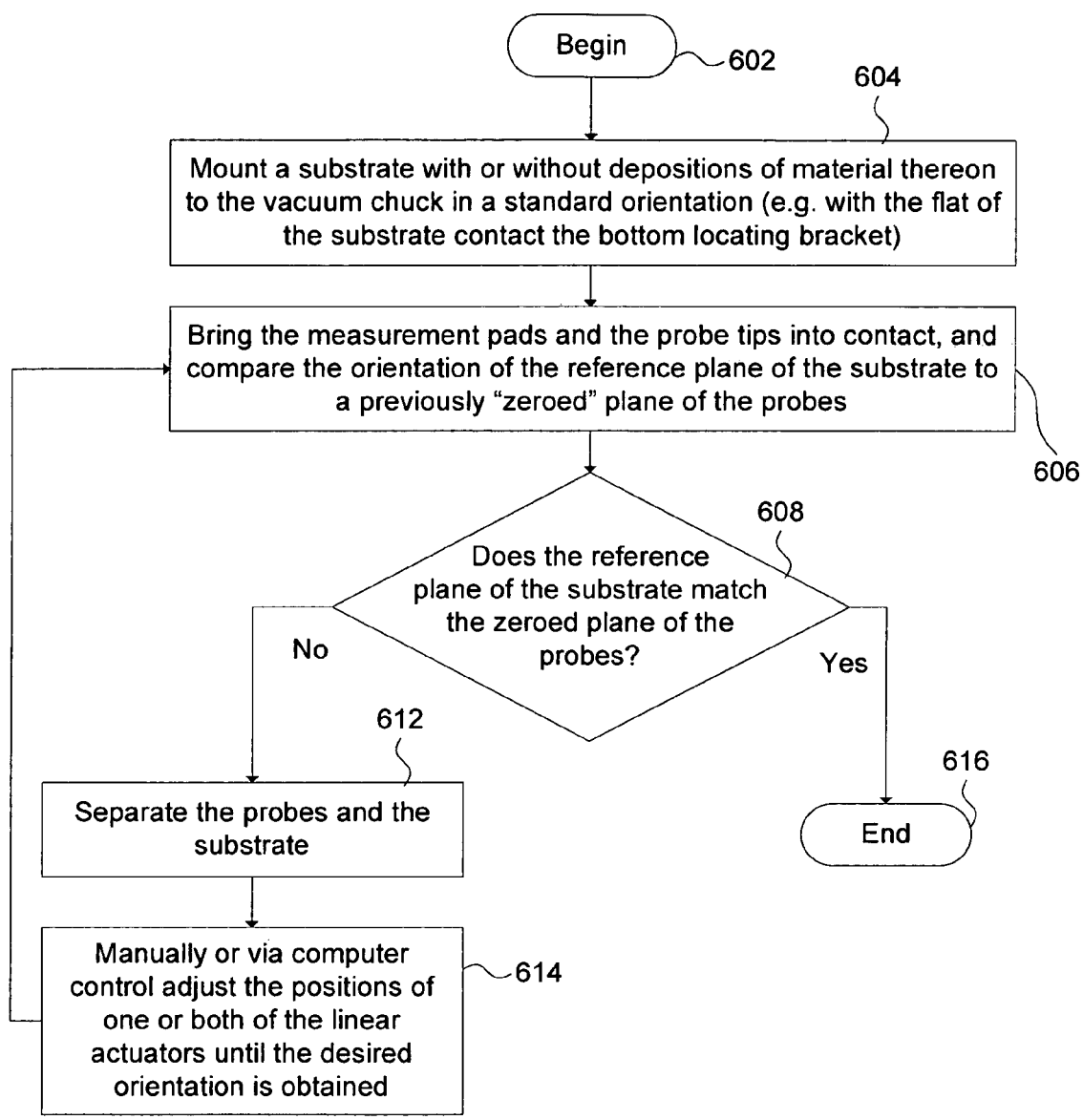
FIG. 21 provides a block diagram setting forth sample operations that may be used in setting the parallelism of the front surface of the substrate (on which layers of material have been deposited and/or are to be deposited), or that of the deposited material itself, relative to the plane cut by the diamond tool.

FIG. 21 provides a flowchart setting forth sample operations that may be used in setting the parallelism of the front surface of the substrate (on which layers of material have been deposited and/or are to be deposited), or that of the deposited material itself, relative to the plane cut by the diamond tool.

Figure 22:
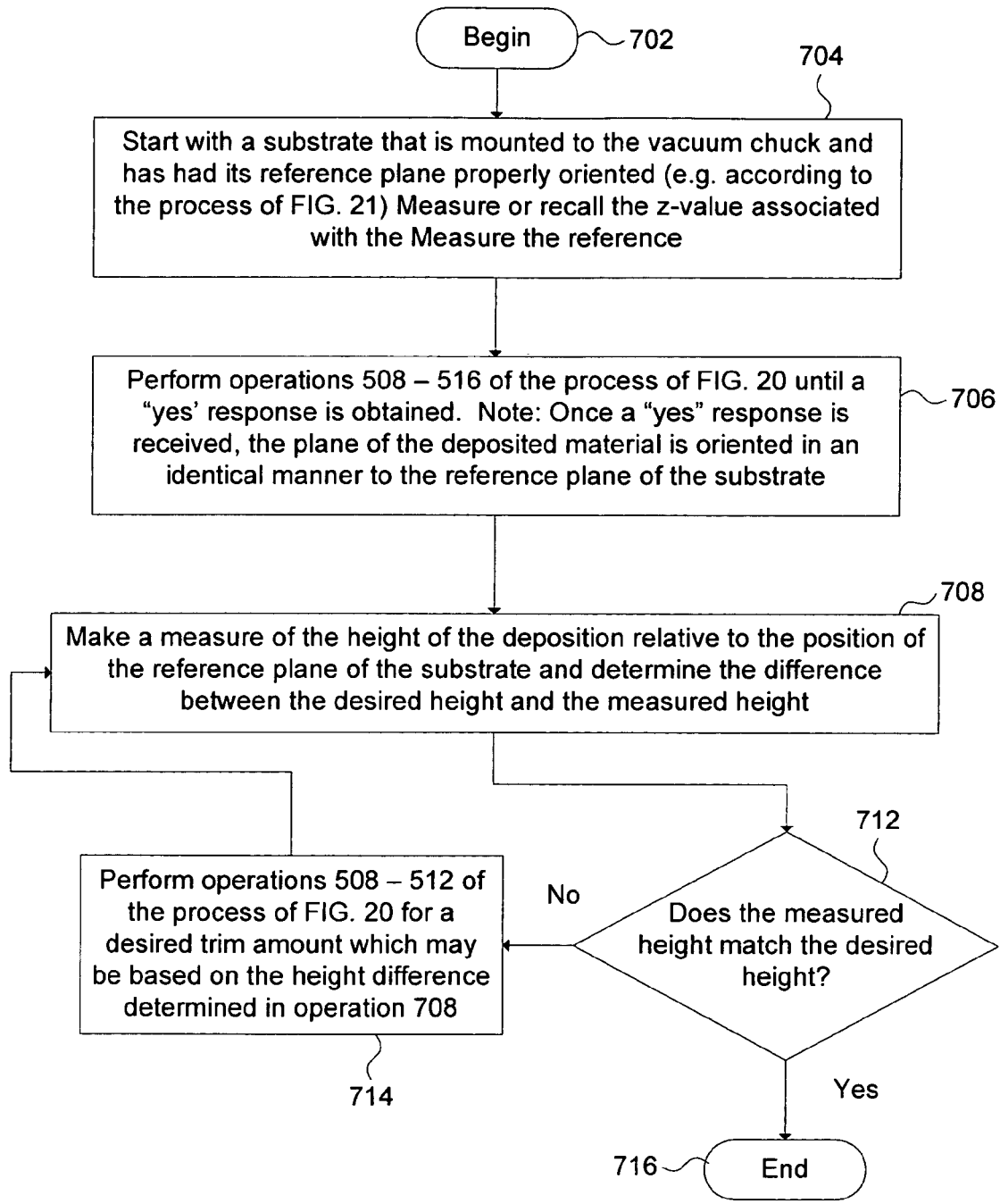
FIG. 22 provides a block diagram setting forth operations that may be used in trimming a deposit of material on the substrate to a desired height using the apparatus of FIG. 13.

FIG. 22 provides a flowchart setting forth operations that may be used in trimming a deposit of material on the substrate to a desired height using the apparatus of FIG. 13.

Alternative methods to those set forth in FIGS. 20-22 will be apparent to those of skill in the art upon review of the teachings herein. In some such alternative processes, various operations may be eliminated, other operations may be added, and/or various substitution operations may be used.

Teachings concerning the formation of structures on dielectric substrates and/or the formation of structures that incorporate dielectric materials into the formation process and possibility into the final structures as formed are set forth in a number of patent applications filed on Dec. 31, 2003. The first of these filings is U.S. Patent Application No. 60/534,184, which is entitled "Electrochemical Fabrication Methods Incorporating Dielectric Materials and/or Using Dielectric Substrates". The second of these filings is U.S. Patent Application No. 60/533,932, which is entitled "Electrochemical Fabrication Methods Using Dielectric Substrates". The third of these filings is U.S. Patent Application No. 60/534,157, which is entitled "Electrochemical Fabrication Methods Incorporating Dielectric Materials". The fourth of these filings is U.S. Patent Application No. 60/533,891, which is entitled "Methods for Electrochemically Fabricating Structures Incorporating Dielectric Sheets and/or Seed layers That Are Partially Removed Via Planarization". A fifth such filing is U.S. Patent Application No. 60/533,895, which is entitled "Electrochemical Fabrication Method for Producing Multi-layer Three-Dimensional Structures on a Porous Dielectric" These patent filings are each hereby incorporated herein by reference as if set forth in full herein.

In view of the teachings herein, many further embodiments, alternatives in design and uses of the instant invention will be apparent to those of skill in the art. As such, it is not intended that the invention be limited to the particular illustrative embodiments, alternatives, and uses described above but instead that it be solely limited by the claims presented hereafter.

We claim:

1. A fabrication process for forming a multi-layer three-dimensional structure, comprising:
    (a) forming and adhering a layer of material to a previously formed layer and/or to a substrate, wherein the layer comprises a desired pattern of at least one material, wherein one or more contact pads exist on the substrate or on a previously formed layer;
    (b) subjecting the at least one material to a planarization operation;
    (c) locating a measurement probe in contact with the one or more contact pads and in contact with material that was subject to the planarization operation and extracting data from the fixture concerning a measured height of planarized material at at least one point relative to a desired reference point or plane;
    (d) comparing the measured height of material to a desired height for the material;
    (e) if the measured and desired heights are not within a desired tolerance, repeating operations (b)-(d) until the measured and desired heights are within the desired tolerance;
    (f) repeating the forming and adhering of operation (a) one or more times to form the three-dimensional structure from a plurality of adhered layers.

2. The process of claim 1 wherein the one or more contact pads comprise at least three contact pads.

3. The process of claim 1 wherein the fixture comprises at least three fixed length standoffs and at least one moveable probe.

4. The process of claim 3 wherein the at least one moveable probe comprises at least three moveable probes.

5. The process of claim 3 wherein the at least one moveable probe comprises at least four moveable probes.

6. The process of claim 3 wherein the at least three fixed standoffs are made to contact the pads and the at least one moveable probe is made to contact the deposited material.

7. The process of claim 3 wherein the at least three fixed standoffs are made to contact the deposited material and the at least one moveable probe is made to contact one of the contact pads.

8. The process of claim 1 wherein forming and adhering of the layer of material involves the selective deposition of a first material, the blanket deposition of a second material.

9. The process of claim 1 wherein forming and adhering of the layer of material involves the selective deposition of a first material, the blanket deposition of a second material and wherein at least one of the first or second materials is deposited via an electroplating operation.

10. The process of claim 1 wherein the planarization operation includes a lapping operation.

11. The process of claim 1 wherein the planarization operation includes a diamond machining operation.

12. A fabrication process for forming a multi-layer three-dimensional structure, comprising:
  (a) forming and adhering a layer of material to a previously formed layer and/or to a substrate, wherein the layer comprises a desired pattern of at least one material, wherein one or more contact pads exist on the substrate or on a previously formed layer;
  (b) subjecting the at least one material to a planarization operation;
  (c) subjecting the at least one material to inspection to determine at least two of the height of the deposition relative to a desired reference, the planarity of the deposition, and the orientation of the deposition relative to a desired reference;
  (d) repeating the forming and adhering of operation (a) one or more times to form the three-dimensional structure from a plurality of adhered layers.

13. The process of claim 12 wherein forming and adhering of the layer of material involves the selective deposition of a first material, the blanket deposition of a second material.

14. The process of claim 12 wherein forming and adhering of the layer of material involves the selective deposition of a first material, the blanket deposition of a second material and wherein at least one of the first or second materials is deposited via an electroplating operation.

15. The process of claim 12 wherein the planarization operation includes a lapping operation.

16. The process of claim 12 wherein the planarization operation includes a diamond machining operation.

* * * * *